(12) United States Patent
    Sakuma et al.

(10) Patent No.: US 9,502,431 B2
(45) Date of Patent: Nov. 22, 2016

(54) NONVOLATILE SEMICONDUCTOR MEMORY DEVICE AND METHOD OF MANUFACTURING THE SAME

(71) Applicant: Kabushiki Kaisha Toshiba, Minato-ku (JP)

(72) Inventors: Kiwamu Sakuma, Yokkaichi (JP); Kensuke Ota, Kawasaki (JP); Masumi Saitoh, Yokkaichi (JP); Chika Tanaka, Yokohama (JP); Daisuke Matsushita, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/747,167

(22) Filed: Jun. 23, 2015

(65) Prior Publication Data

US 2016/0079268 A1   Mar. 17, 2016

(30) Foreign Application Priority Data

Sep. 17, 2014   (JP) ................................. 2014-188757

(51) Int. Cl.
| | |
|---|---|
| *H01L 27/115* | (2006.01) |
| *H01L 29/66* | (2006.01) |
| *H01L 21/02* | (2006.01) |
| *H01L 29/24* | (2006.01) |
| *H01L 29/788* | (2006.01) |
| *H01L 29/792* | (2006.01) |

(52) U.S. Cl.
CPC ... *H01L 27/11582* (2013.01); *H01L 27/11556* (2013.01); *H01L 29/24* (2013.01); *H01L 29/66969* (2013.01); *H01L 29/7889* (2013.01); *H01L 29/7926* (2013.01)

(58) Field of Classification Search
CPC .................. H01L 27/11582; H01L 27/11556; H01L 29/24; H01L 29/66969; H01L 29/7889; H01L 29/7926
See application file for complete search history.

(56) References Cited

U.S. PATENT DOCUMENTS

| | | |
|---|---|---|
| 2004/0188778 A1 | 9/2004 | Aoyama |
| 2007/0252201 A1 | 11/2007 | Kito et al. |
| 2009/0121271 A1 | 5/2009 | Son et al. |
| 2013/0069054 A1 | 3/2013 | Isobe et al. |

FOREIGN PATENT DOCUMENTS

| | | |
|---|---|---|
| JP | 2004-303894 | 10/2004 |
| JP | 2007-266143 | 10/2007 |
| JP | 2012-185884 | 9/2012 |
| JP | 2013-77815 | 4/2013 |

OTHER PUBLICATIONS

Jaehoon Jang et al. "Vertical Cell Array Using TCAT (Terabit Cell Array Transistor) Technology for Ultra High Density NAND Flash Memory" Symposium on VLSI Technology Digest of Technical Papers, 2009, 2 pages.

*Primary Examiner* — Whitney T Moore
(74) *Attorney, Agent, or Firm* — Oblon, McClelland, Maier & Neustadt, L.L.P.

(57) ABSTRACT

According to one embodiment, a memory device includes a first stacked layer structure stacked in order of a first insulating layer, a first electrode layer, . . . an n-th insulating layer, an n-th electrode layer, and an (n+1)-th insulating layer in a first direction perpendicular to a surface of a semiconductor substrate, where n is a natural number, an oxide semiconductor layer extending through the first to n-th electrode layers in the first direction, a second stacked layer structure provided between the first to n-th electrode layers and the oxide semiconductor layer, and including a charge storage layer which storages charges, and a area provided in the oxide semiconductor layer.

21 Claims, 37 Drawing Sheets

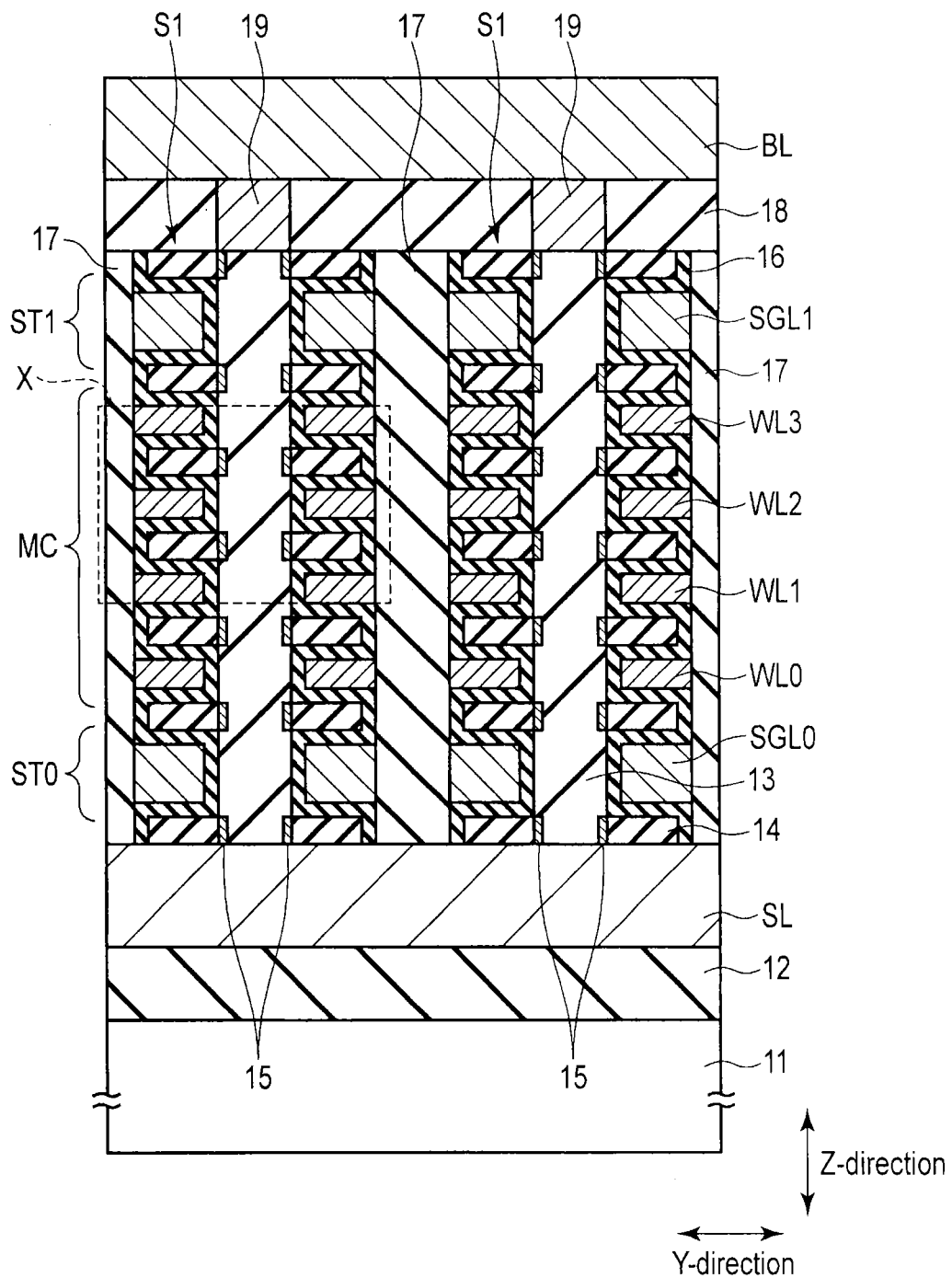
F I G. 2

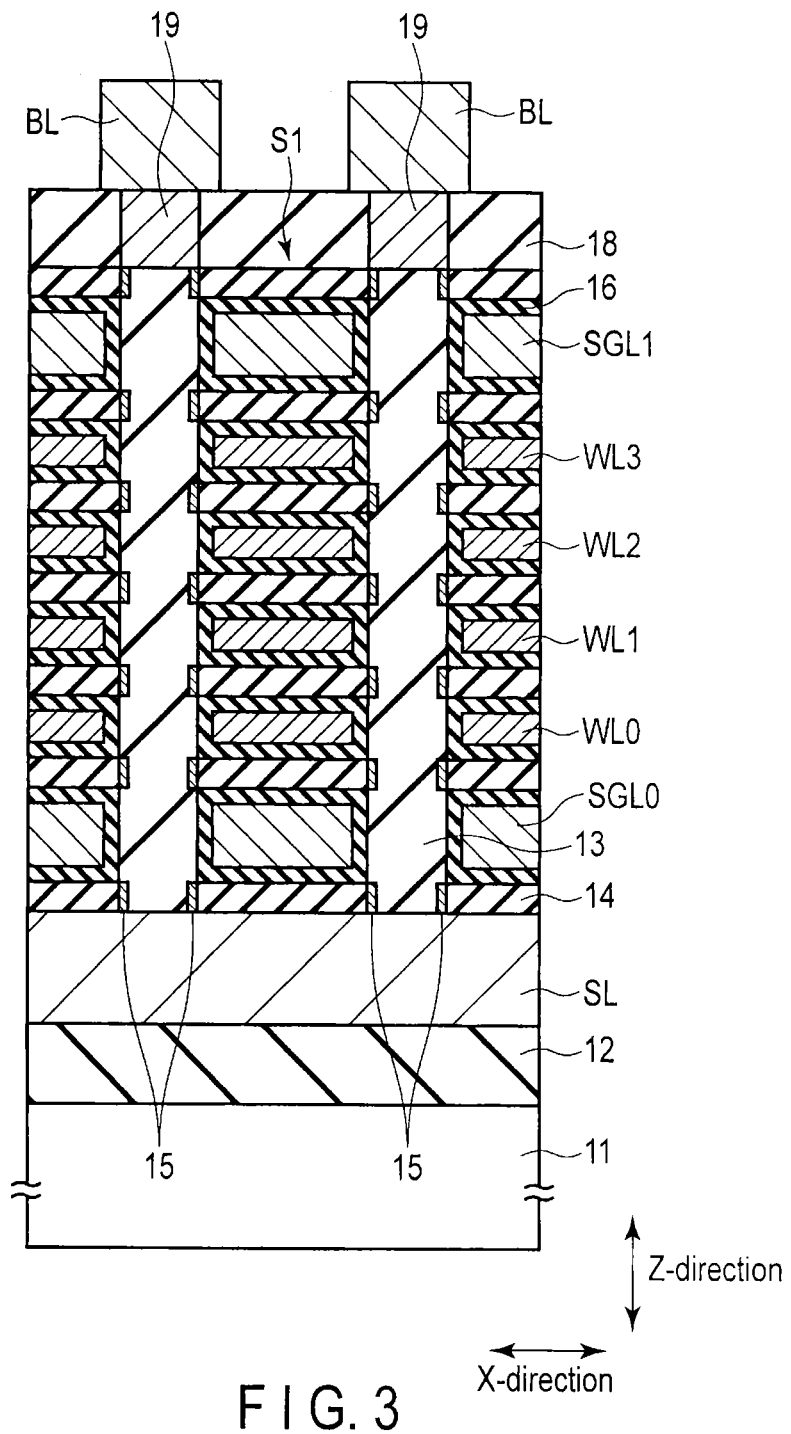
F I G. 3

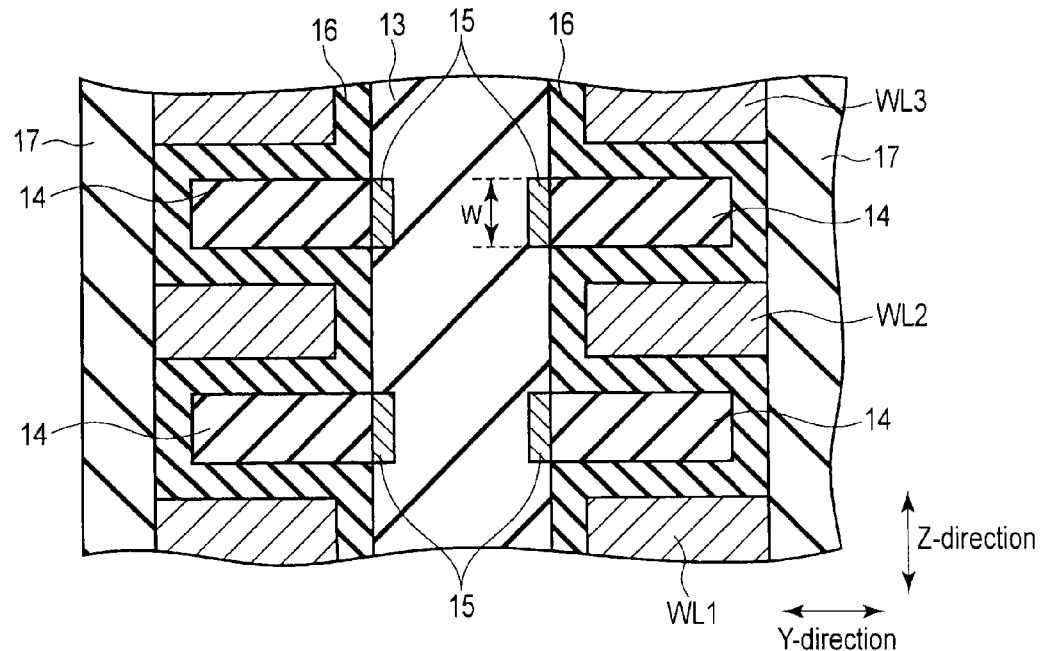
F I G. 4
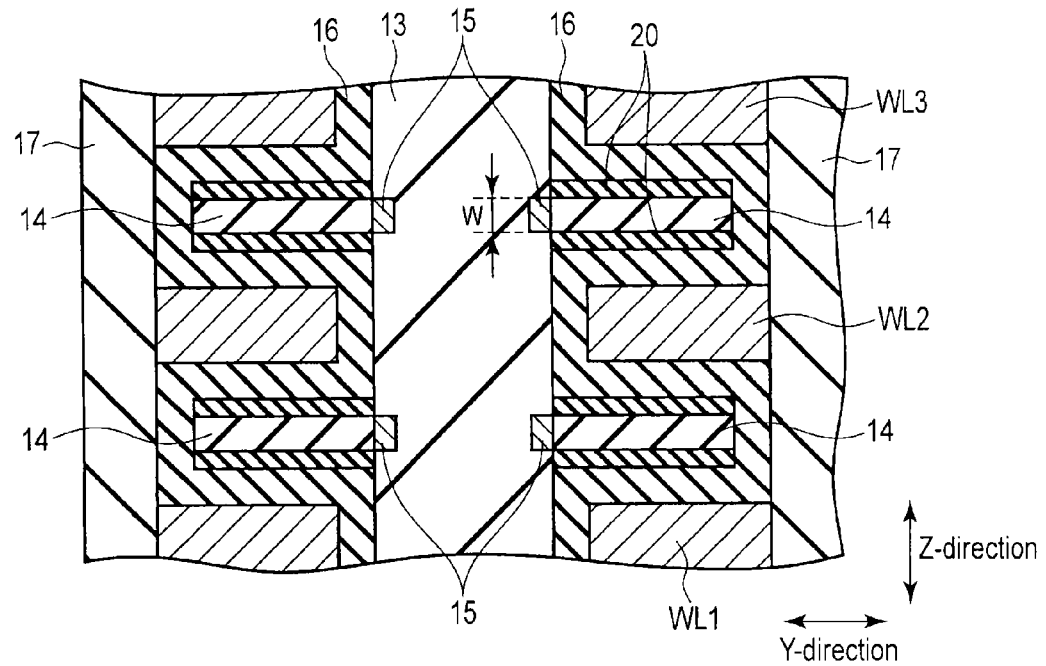
F I G. 5

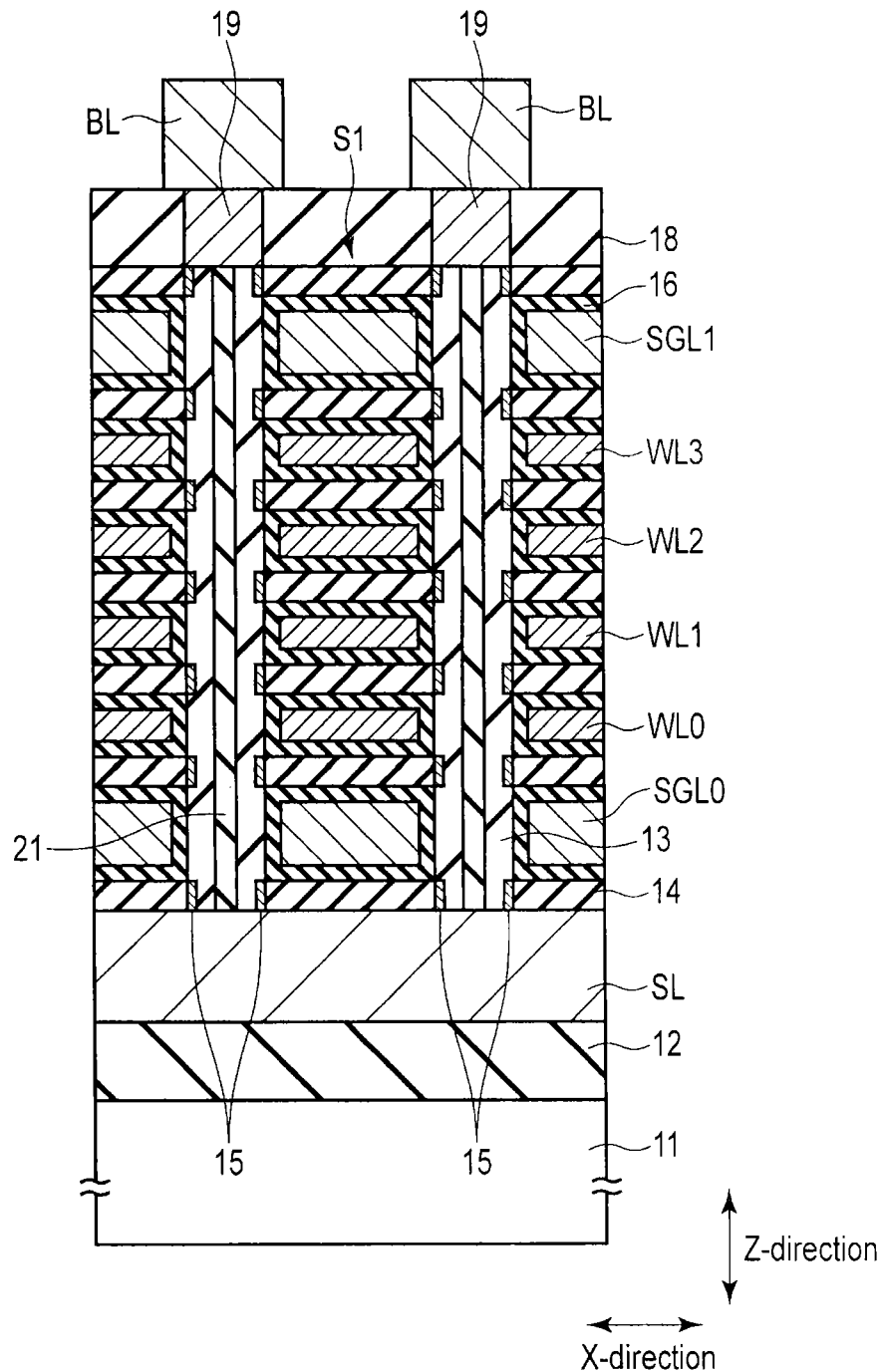
F I G. 9

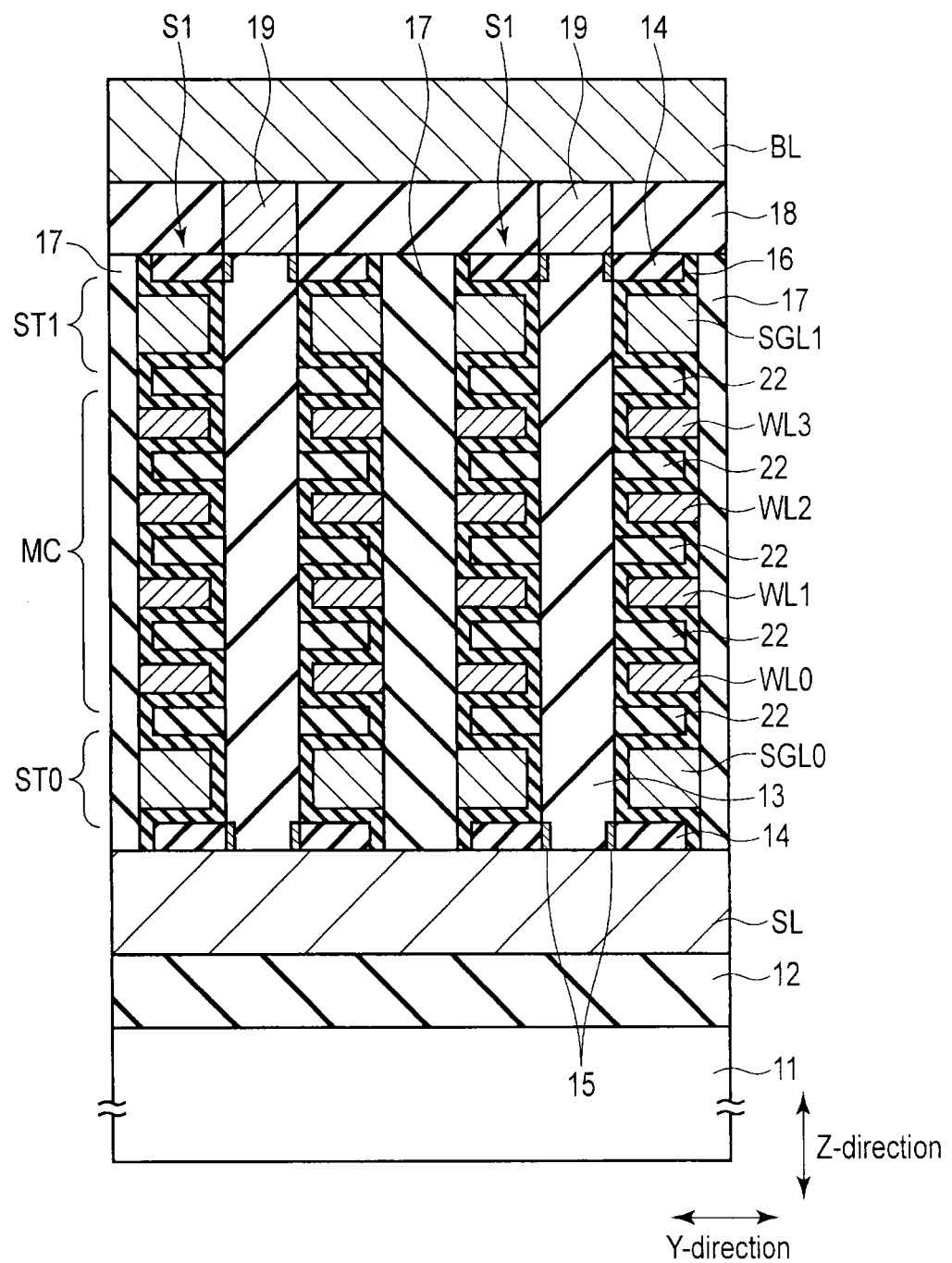
F I G. 14

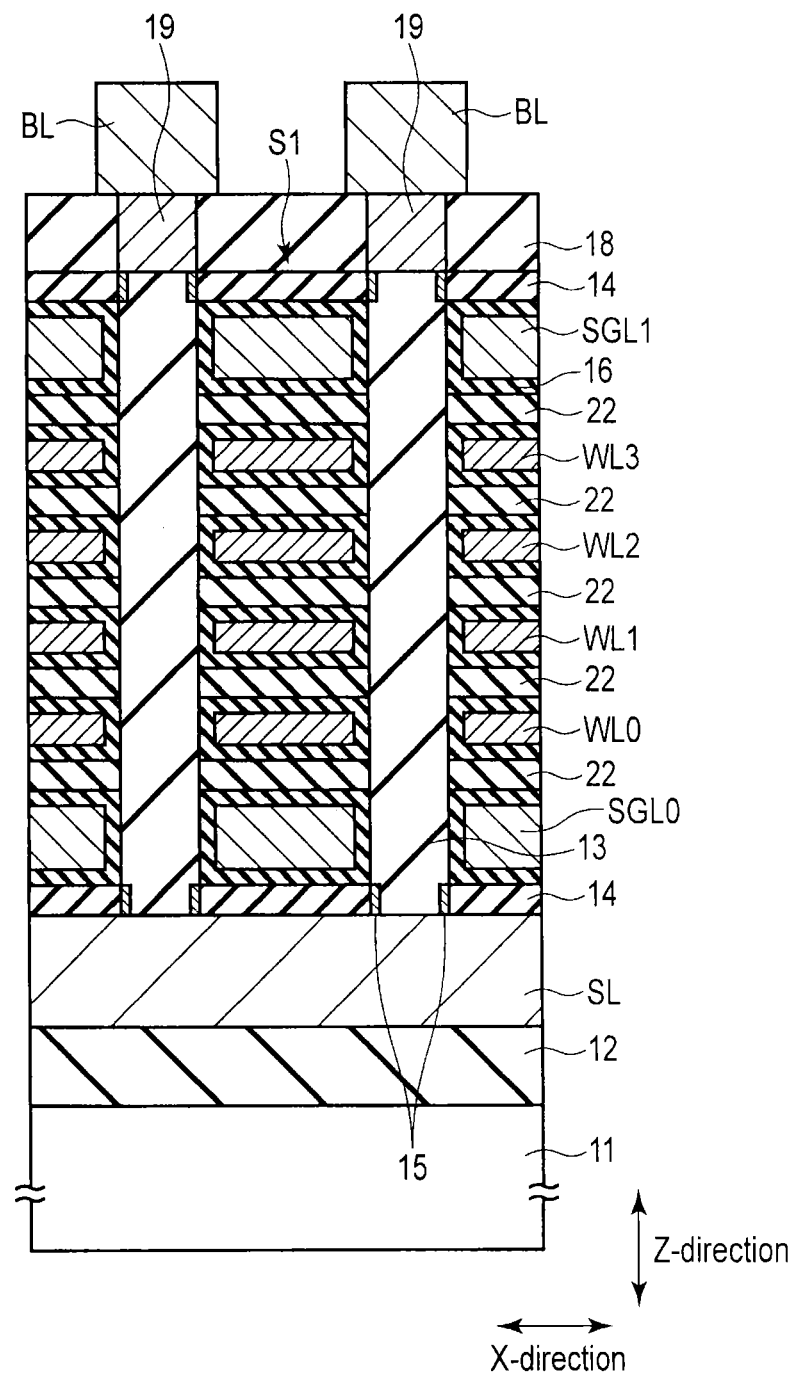
F I G. 15

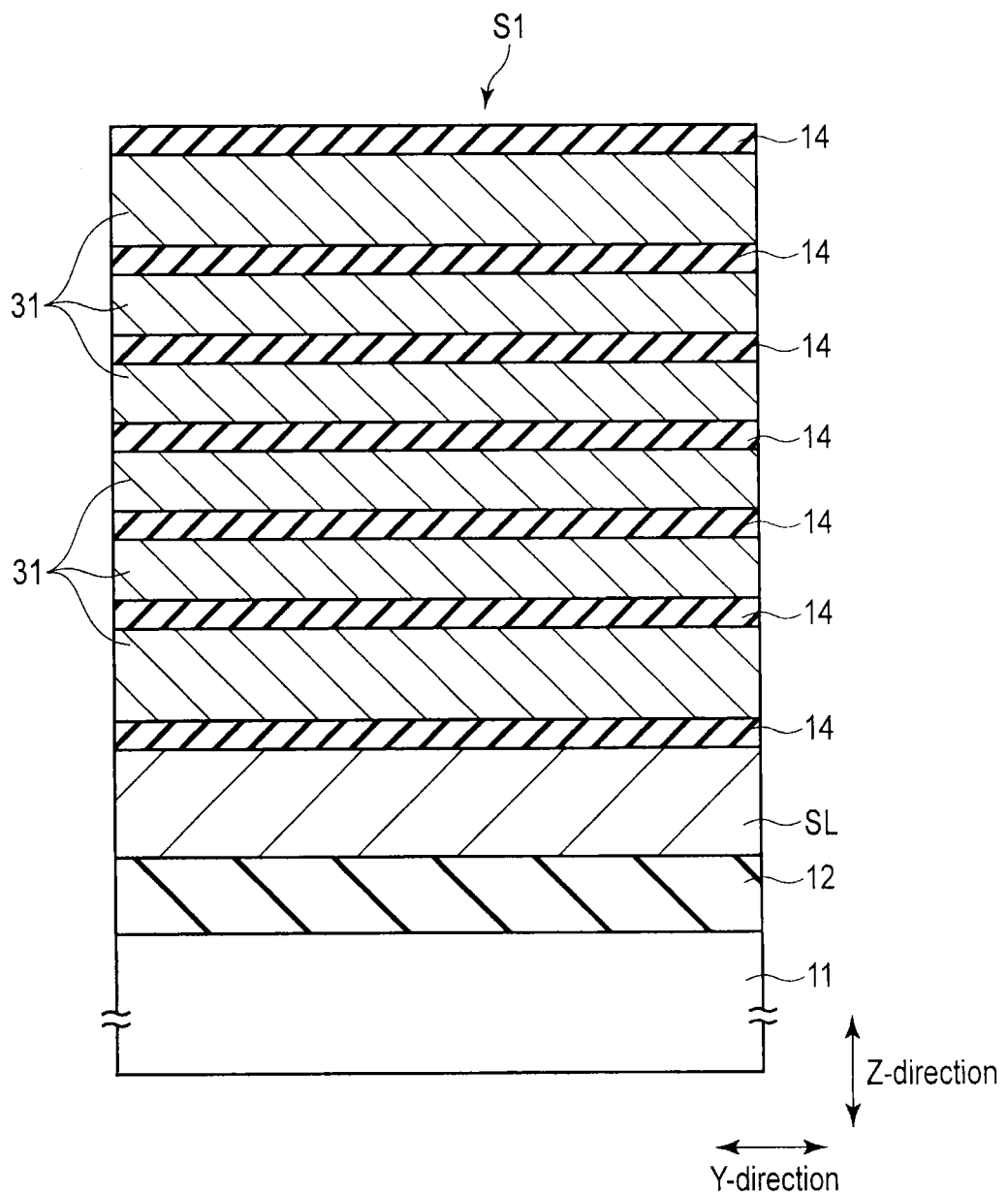
F I G. 16

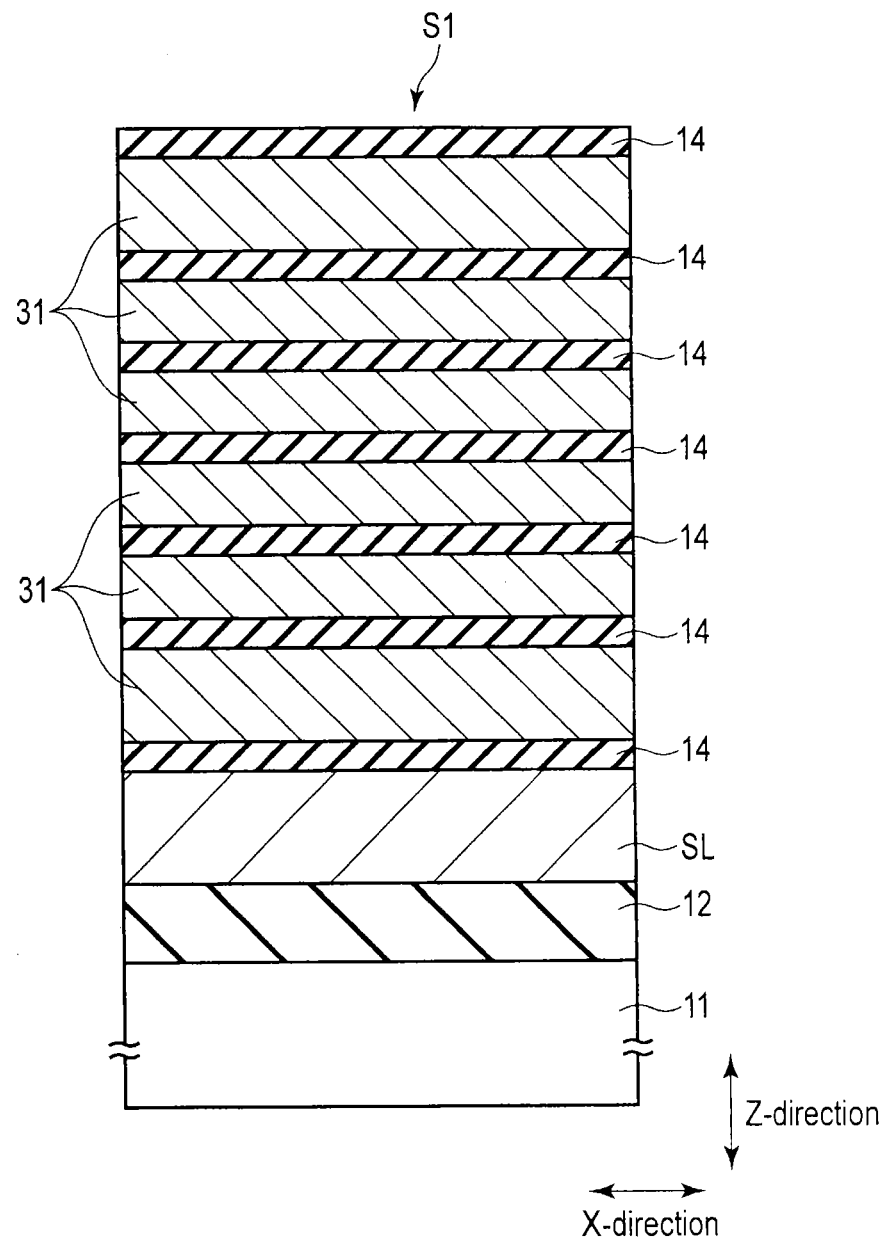
F I G. 17

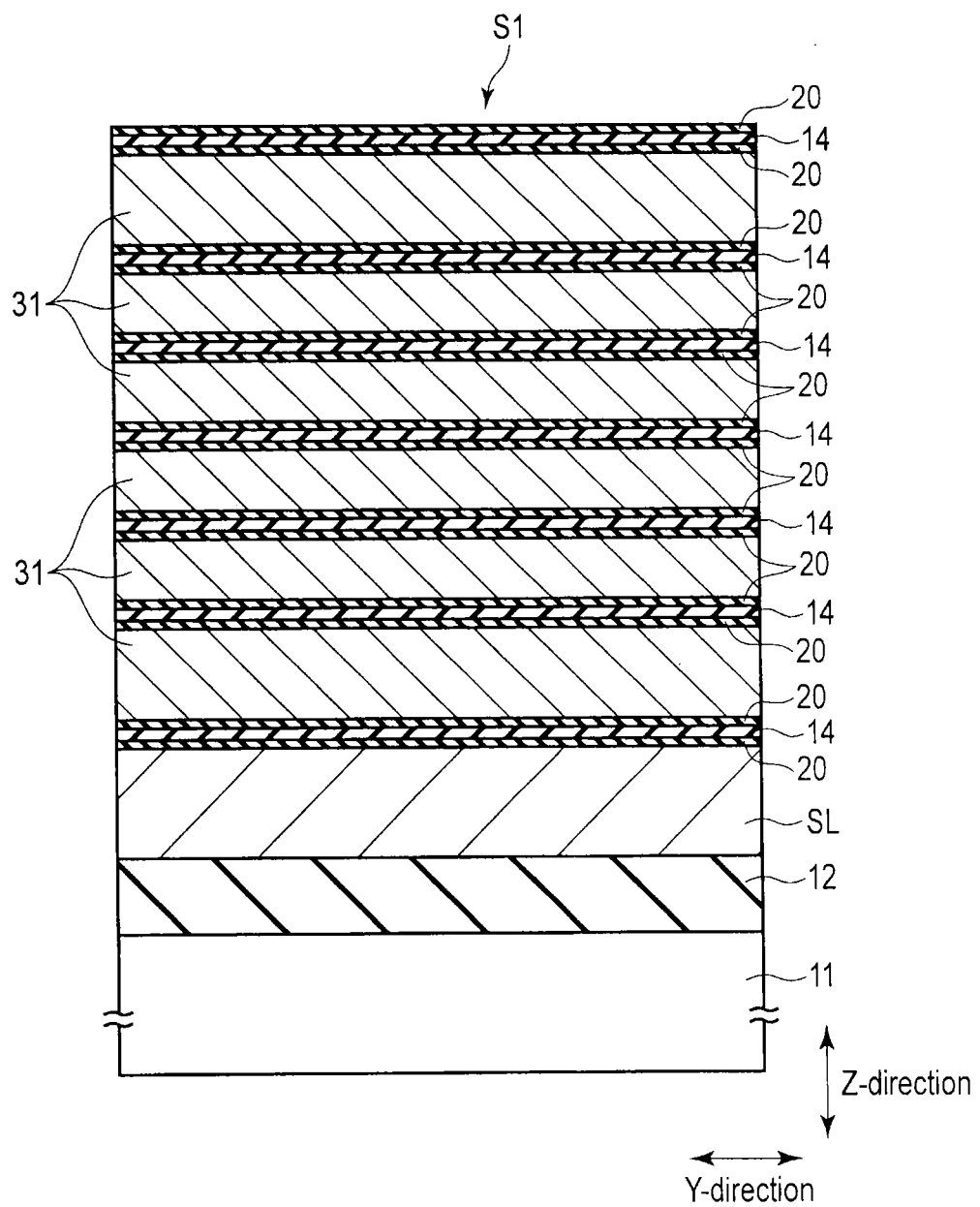
F I G. 18

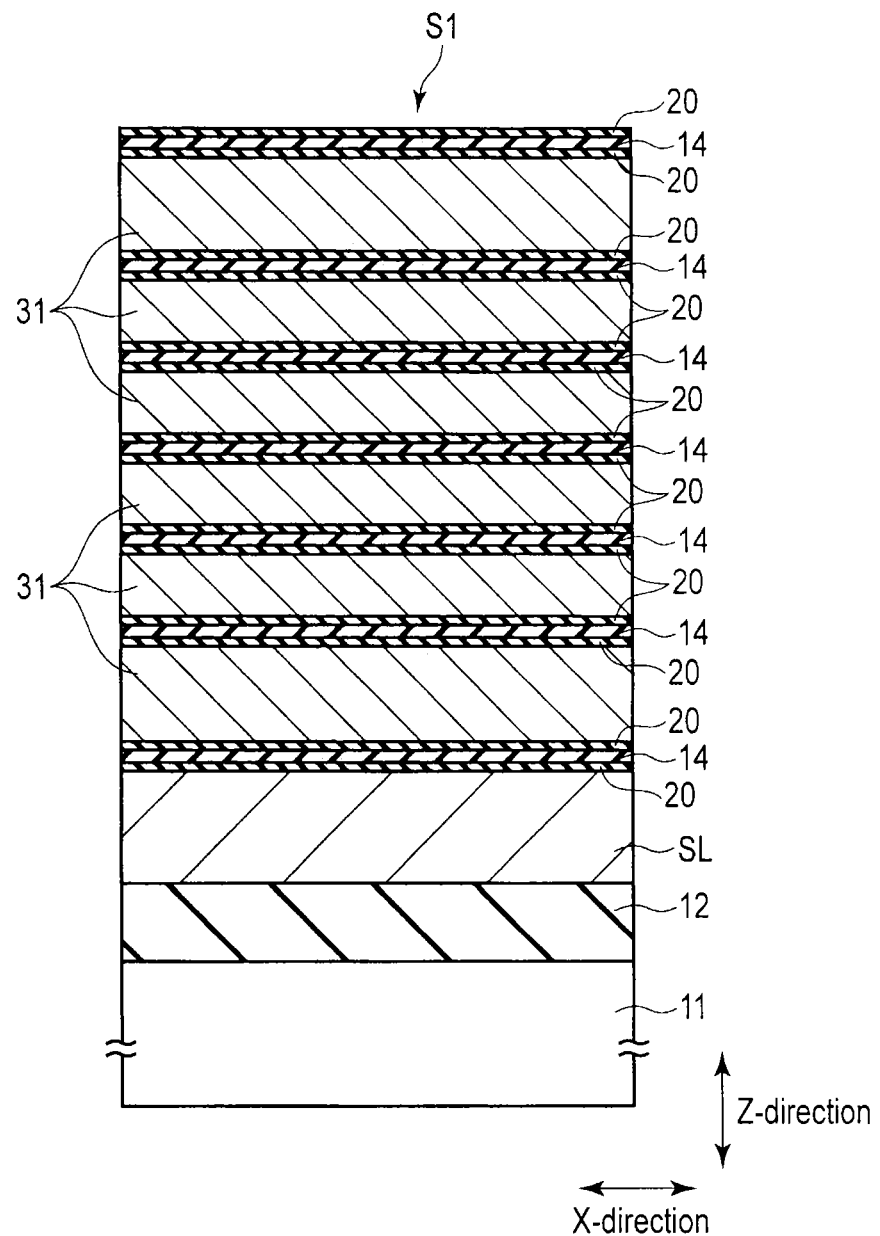
F I G. 19

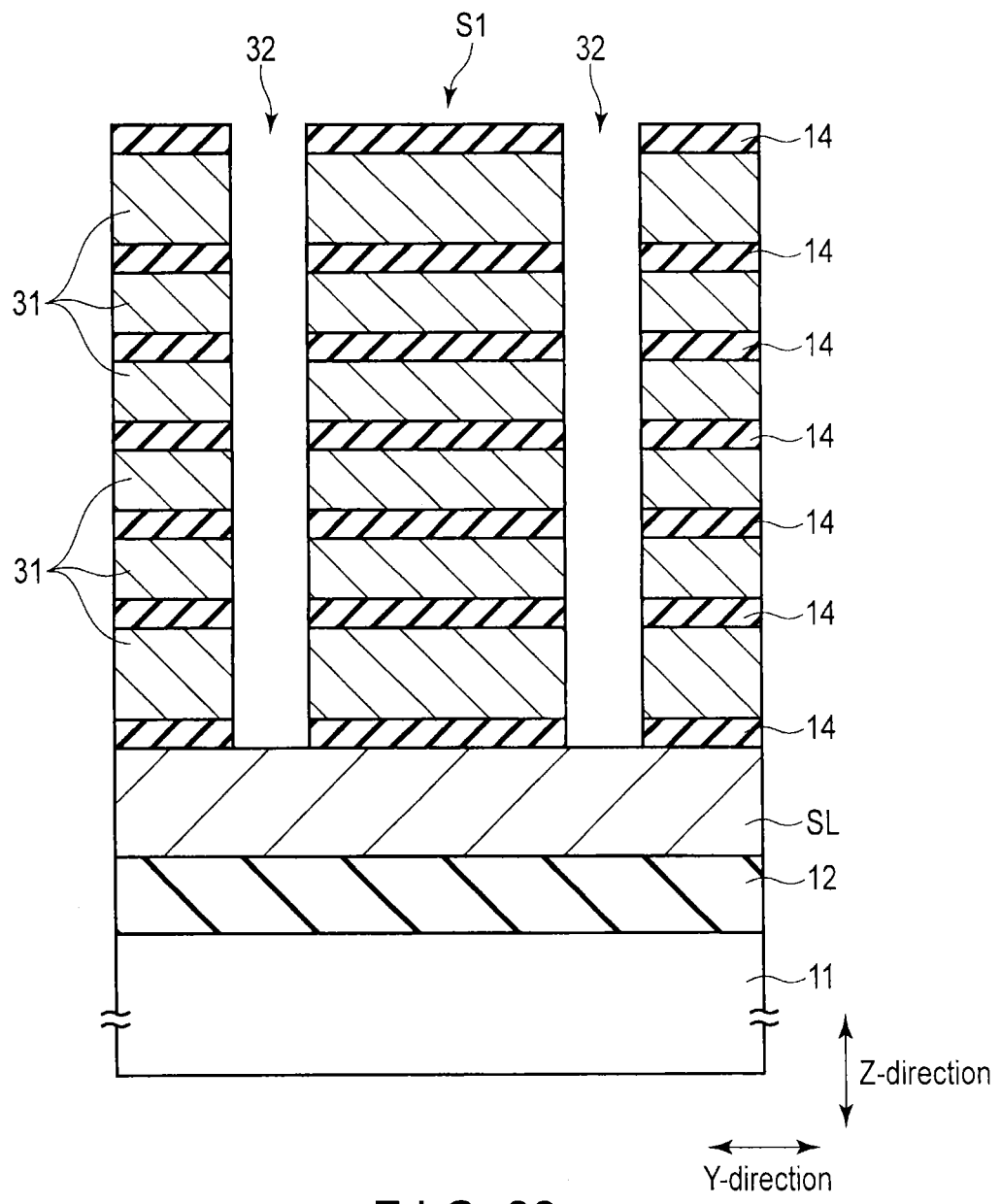
F I G. 22

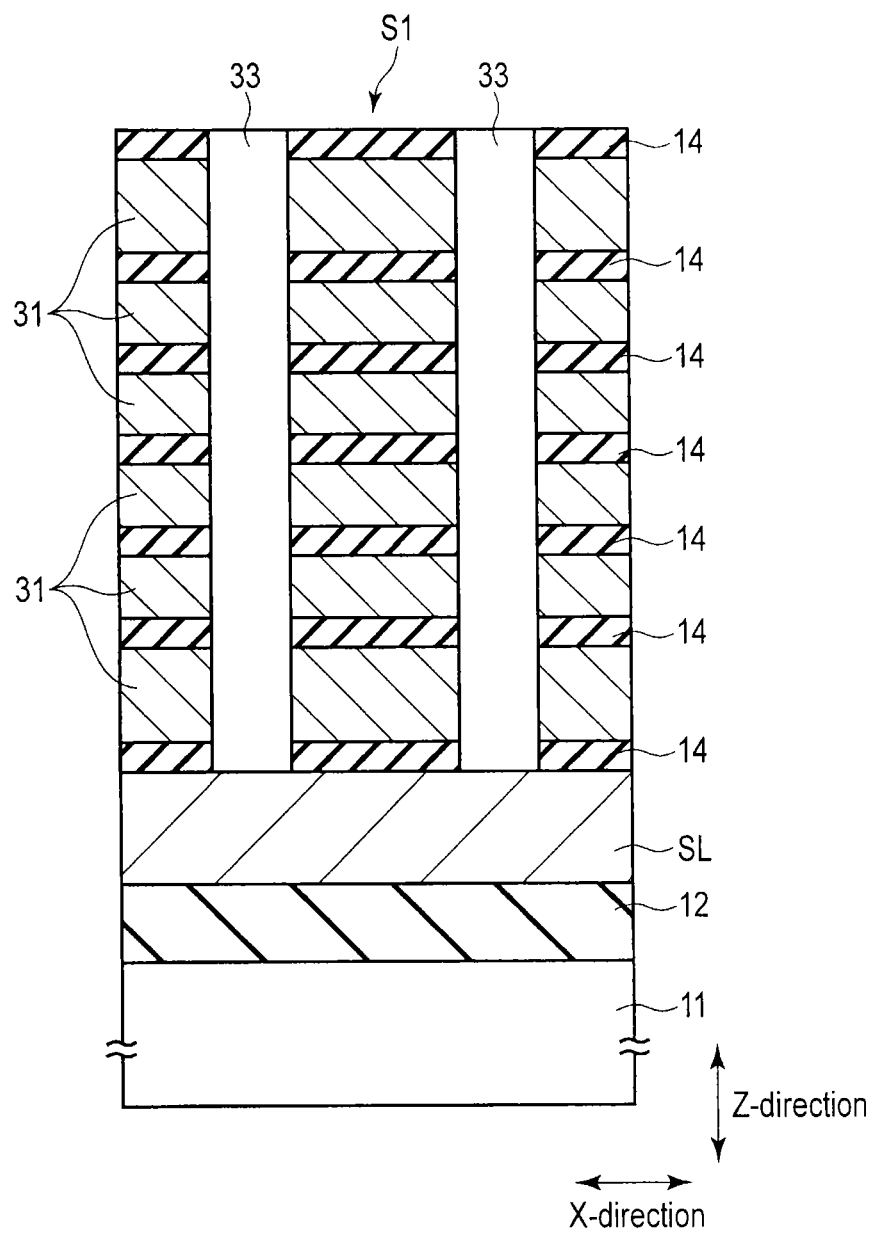
F I G. 25

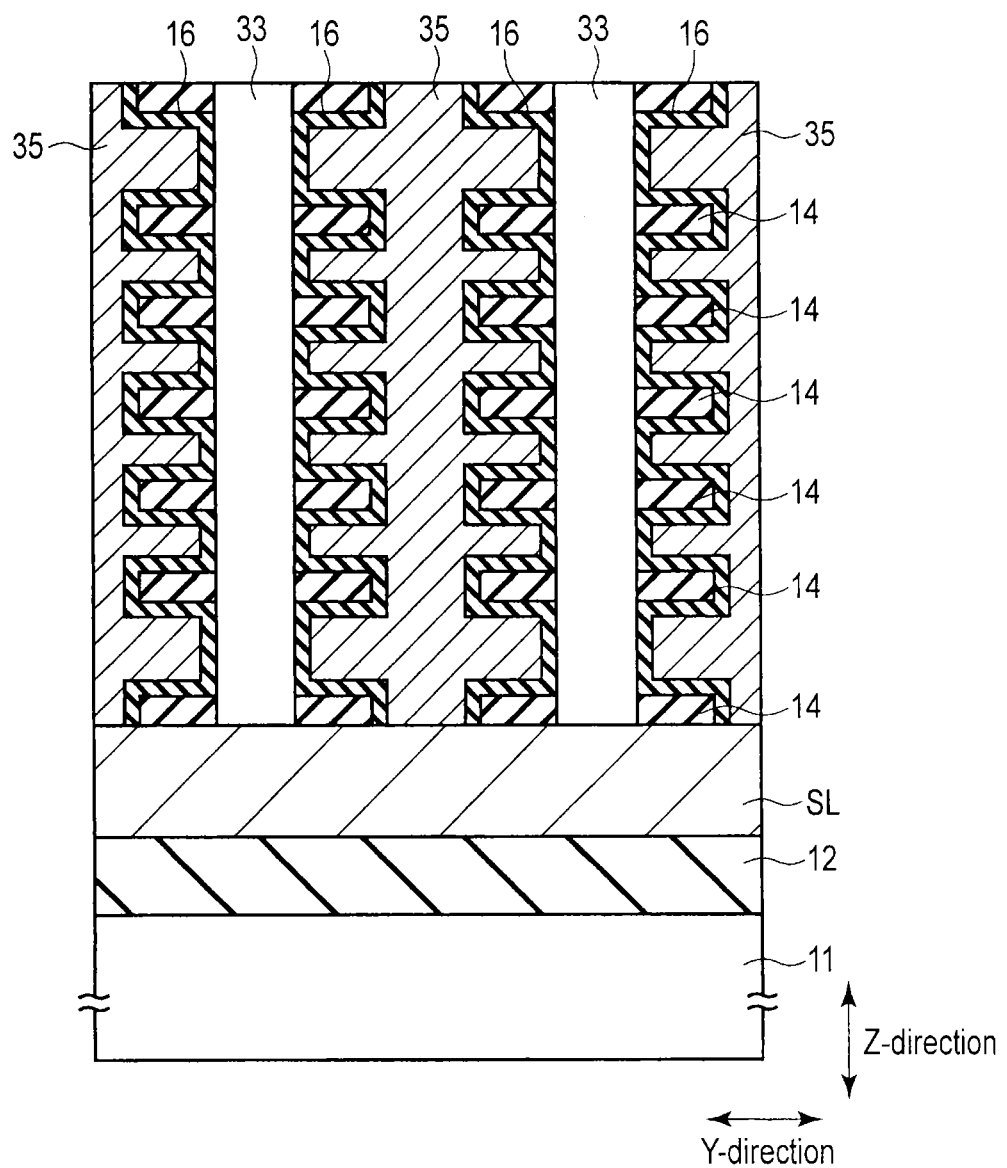
F I G. 30

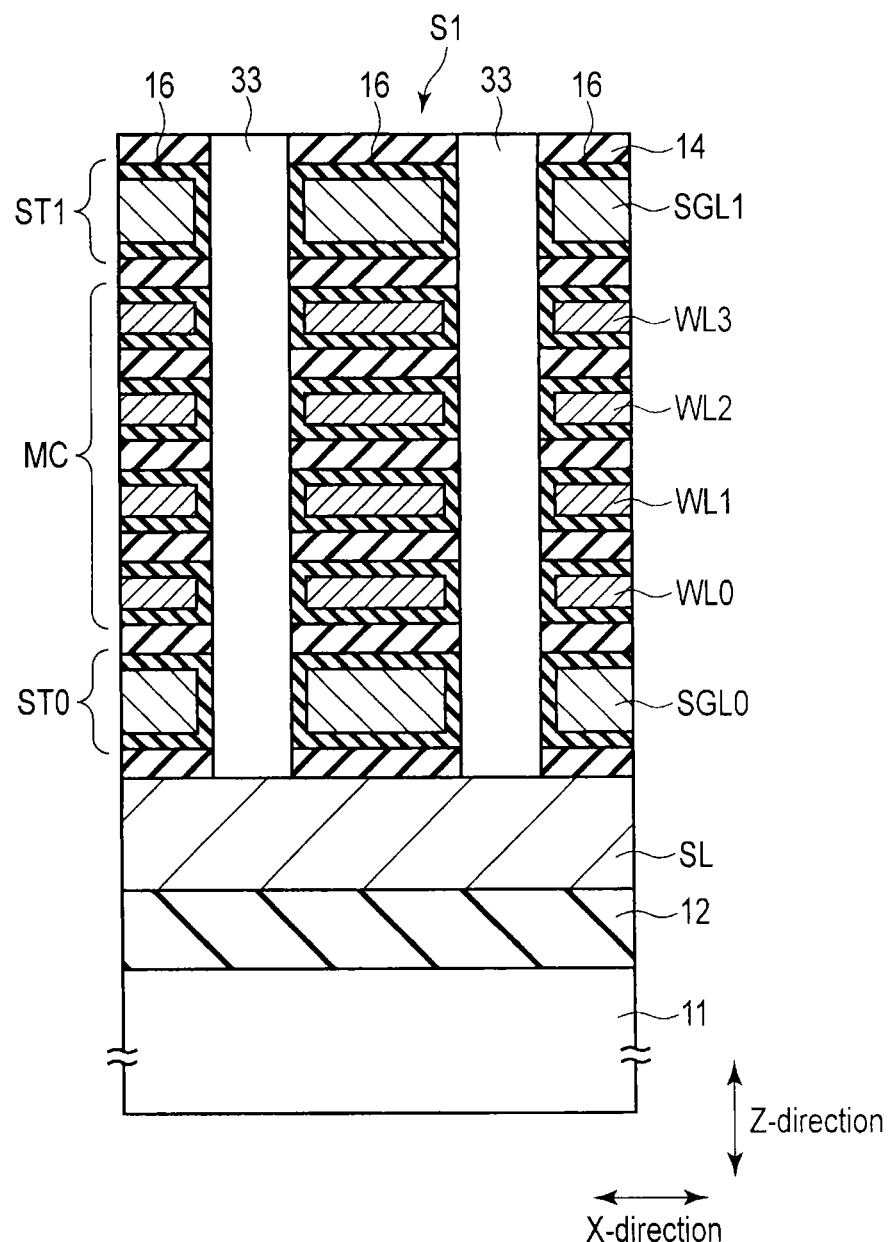
F I G. 35

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2014-188757, filed Sep. 17, 2014, the entire contents of which are incorporated herein by reference.

FIELD

Embodiments described herein relate generally to a nonvolatile semiconductor memory device and a method of manufacturing the same.

BACKGROUND

NAND flash memories have become widespread as large-capacity memory devices. Cost reduction per bit and capacity increase has recently been achieved by microfabricating memory elements, with further microfabrication expected in future. However, to further reduce the size of a flash memory, many issues must be tackled, such as further development of lithographic techniques, enhancing the short-channel effect, and suppressing interference between elements or variation in the elements. Consequently, it is likely to become difficult to continuously increase storage density merely by the use of simple in-plane microfabrication techniques.

To increase the degree of integration of memory cells, recent research and development has focused on changing the structure of the memory cells from the conventional two-dimensional (planar) structure to a three-dimensional (solid) one, and to this end various types of three-dimensional nonvolatile semiconductor memory devices have been proposed. In a vertical-channel stacked memory as one such three-dimensional device, wherein, for example, a string of memory cells is arranged vertically on the surface of a substrate, insulating layers and electrode layers acting as word lines are alternately stacked on the substrate and then through-holes formed in the resulting structure, thereby forming alternating charge accumulation layers and channel layers (of, for example, silicon) on the inner surface of each through-hole.

In the above-described vertical-channel stacked memory, however, the resistance between memory cells formed on a channel layer may increase and, as a result, reading and writing of the memory cells will become slower. To counter this, a technique of doping a channel layer between memory cells to thereby form an impurity diffusion layer of reduced resistance has been proposed. This technique is, however, problematic in that the impurity diffusion layer may expand undesirably as a result of heat treatment performed after its formation. Such expansion of the impurity diffusion layer impairs the enhanced performance and integration of the vertical-channel stacked memory.

BRIEF DESCRIPTION OF THE DRAWINGS

FIG. 2 is a cross-sectional view taken along line II-II of FIG. 1;

FIG. 3 is a cross-sectional view taken along line of FIG. 1;

FIG. 4 is an expanded cross-sectional view showing the structure of area X shown in FIG. 2;

FIG. 5 is an expanded cross-sectional view showing a modification of the structure of area X shown in FIG. 2;

FIG. 9 is a cross-sectional view taken along line IX-IX of FIG. 7;

FIGS. 14 and 15 are cross-sectional views showing a third modification; and

FIGS. 16 to 39 are cross-sectional views showing a method of manufacturing the nonvolatile semiconductor memory devices shown in FIGS. 1 to 15.

DETAILED DESCRIPTION

In general, according to one embodiment, a nonvolatile semiconductor memory device comprises: a first stacked structure comprising a first insulating layer, a first electrode layer, ... an n-th insulating layer, an n-th electrode layer, and an (n+1)-th insulating layer stacked in a mentioned order in a first direction, where n is a natural number; an oxide semiconductor layer extending through the first to n-th electrode layers in the first direction; a second stacked structure provided between the first to n-th electrode layers and the oxide semiconductor layer, and including a charge storage layer which accumulates charges; and a area provided in the oxide semiconductor layer in contact with at least one of the first to (n+1)-th insulating layers, having a composition ratio of oxygen lower than a composition ratio of oxygen in the oxide semiconductor layer.

Embodiments will be described with reference to the accompanying drawings. In the embodiments, like reference numbers denote like elements, and no duplicate descriptions will be given. Further, the figures are schematic ones for assisting the description and understanding of the invention, and the shape, size, ratio, etc., shown therein may differ from the actual ones. The shape, size, ratio, etc. can be appropriately designed or changed in view of the description below or known techniques.

1. First Embodiment

Figure 1:
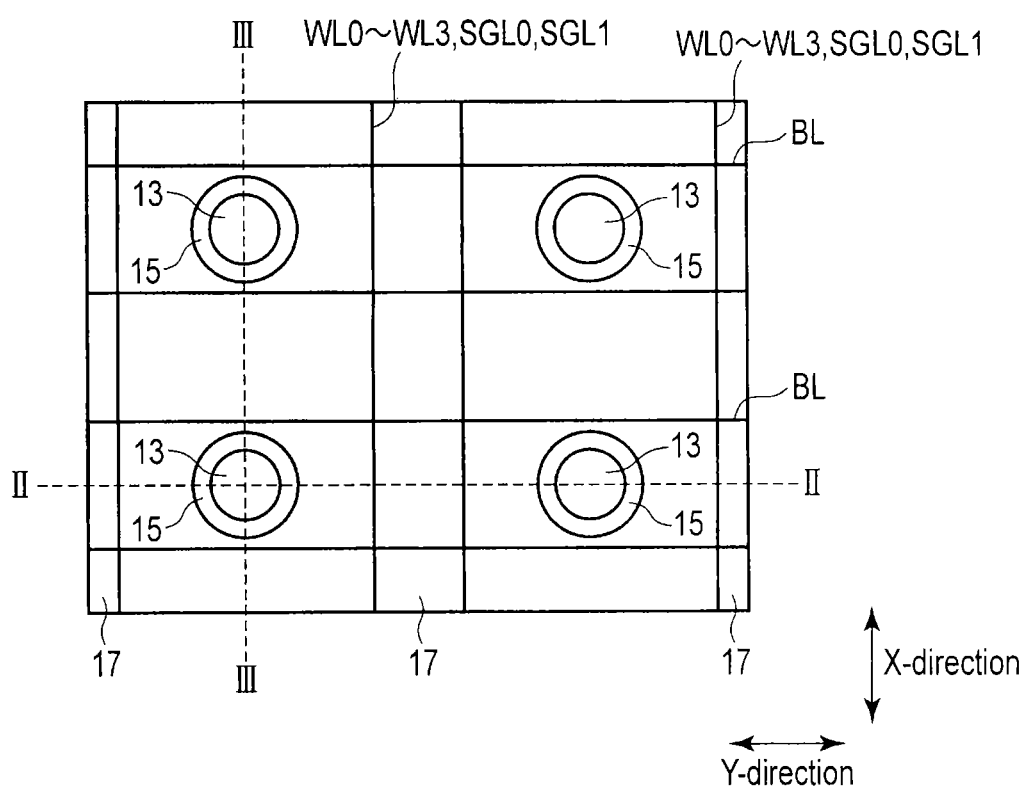
FIG. 1 is a plan view showing a nonvolatile semiconductor memory device according to a first embodiment.

FIG. 1 is a plan view showing a nonvolatile semiconductor memory device according to a first embodiment. FIG. 2 is a cross-sectional view taken along line II-II of FIG. 1, and FIG. 3 is a cross-sectional view taken along line of FIG. 1.

A semiconductor substrate 11 is, for example, a silicon substrate. An insulating layer 12 is formed on the semiconductor substrate 11. A source line (conductive line) SL is provided on the insulating layer 12. The source line SL may have a shape of a plate or a line. If the source line SL is in the shape of a line, it may extend in an X direction parallel to the surface of the semiconductor substrate 11, or in a Y direction parallel to the surface of the semiconductor substrate 11 and perpendicular to the X direction.

First stacked structure S1 is constructed such that a first insulating layer, a first electrode layer, ..., an n-th insulating layer, an n-th electrode layer and an (n+1)th electrode layer are stacked on each other in this order on the surface of the semiconductor substrate 11 in a Z direction (n is a natural number).

When n is 1, only one vertical-type transistor is formed. When n is not less than 2, vertical-type transistors are connected in series. Further, when a memory cell array of a NAND structure is realized, n is desirably not less than 4.

In the first embodiment, n is 6.

In this case, first and sixth electrode layers are gates (select gate lines) SGL0 and SGL1 of select transistors ST0 and ST1, and second, third, fourth and fifth electrode layers are gates (word lines) WL1, WL2, WL3 and WL4 of memory cells MC. In the first embodiment, select gate lines SGL0 and SLG1 and word lines WL1, WL2, WL3 and WL4 extend in the X direction.

Further, first to seventh insulating layers are interlayer insulating layers 14.

The interlayer insulating layers 14 comprise a material having a function of deoxidizing oxide semiconductor layers 13. For instance, each interlayer comprises a silicon-rich oxide silicon layer, a hydrogen-rich insulating layer, or the like. The hydrogen-rich insulating layer is, for example, a hydrogen-rich alumina layer.

The oxide semiconductor layers 13 are provided on the source line SL and extend through first stacked structure S1 in the Z direction. The first end (lower surface) of each oxide semiconductor layer 13 is connected to the source line SL. Each oxide semiconductor layer 13 is, for example, a cylindrical semiconductor layer having a cylindrical shape.

The oxide semiconductor layers 13 contain, for example, an element selected from a group consisting of In, Gamut, Zn and Sn. The oxide semiconductor layers 13 comprise, for example, an InGzZn oxide (for example, $InGzZnO_4$).

Low-resistance areas 15 are provided within the oxide semiconductor layers 13 in contact with the interlayer insulating layers 14. The low-resistance areas 15 surround the oxide semiconductor layers 13 on the X-Y plane. The low-resistance areas 15 have a lower composition ratio of oxygen than the oxide semiconductor layers 13 for the reason described below, and has a lower resistance than the oxide semiconductor layers 13.

Namely, if the interlayer insulating layer 14 is a silicon-rich oxide silicon layer, when the oxide semiconductor layer 13 contacts the interlayer insulating layer 14, oxygen in the oxide semiconductor layer 13 moves into the silicon-rich oxide silicon layer, whereby the oxide semiconductor layer 13 is deoxidized. As a result, the oxide semiconductor layers 13 contacting the interlayer insulating layers 14 will change to a material having a lower composition ratio of oxygen than the other oxide semiconductor layers 13, and having a resistance lower than the other oxide semiconductor layers 13. Because of this, the low-resistance areas 15 are formed within the oxide semiconductor layers 13 in contact with the interlayer insulating layers 14.

Similarly, if the interlayer insulating layer 14 is a hydrogen-rich insulating layer (for example, an alumina layer), when the oxide semiconductor layer 13 contacts the interlayer insulating layer 14, oxygen in the oxide semiconductor layer 13 moves into the hydrogen-rich insulating layer, whereby the oxide semiconductor layer 13 is deoxidized. As a result, the oxide semiconductor layers 13 contacting the interlayer insulating layers 14 will change to a material having a lower composition ratio of oxygen than the other oxide semiconductor layers 13, and having a resistance lower than the other oxide semiconductor layers 13. Because of this, the low-resistance areas 15 are formed within the oxide semiconductor layers 13 in contact with the interlayer insulating layers 14.

The low-resistance areas 15 differ from an impurity diffusion layer. Accordingly, even if a thermal treatment is performed after the low-resistance areas 15 are formed, the low-resistance areas 15 are not excessively expanded. This enables a device structure advantageous for high performance and high integration to be realized.

For instance, as shown in FIG. 4, the width W of the low-resistance area 15 in the Z direction is substantially equal to the width of the interlayer insulating layer 14 in the Z direction.

Further, the width W of the low-resistance area 15 in the Z direction can be controlled as shown in FIG. 5. In the example of FIG. 5, the interlayer insulating layer 14 has a stacked structure comprising a silicon-rich oxide silicon layer or a hydrogen-rich insulating layer, and two stoichiometric insulating layers (of, for example, $SiO_2$) 20 that hold therebetween the silicon-rich oxide silicon layer or the hydrogen-rich insulating layer in the Z direction.

By thus controlling the width W of the low-resistance area 15 in the Z direction, high-speed read/write operation due to the low-resistance area 15 and suppression of short-channel effect (off-leak current) can be simultaneously realized.

Second stacked structures (gate insulating layer structures) 16 are provided between select gate lines SGL0 and SGL1 and the oxide semiconductor layers 13, and between word lines WL1, WL2, WL3 and WL4 and the oxide semiconductor layers 13, and comprise charge accumulating layers for accumulating charges.

Figure 6:
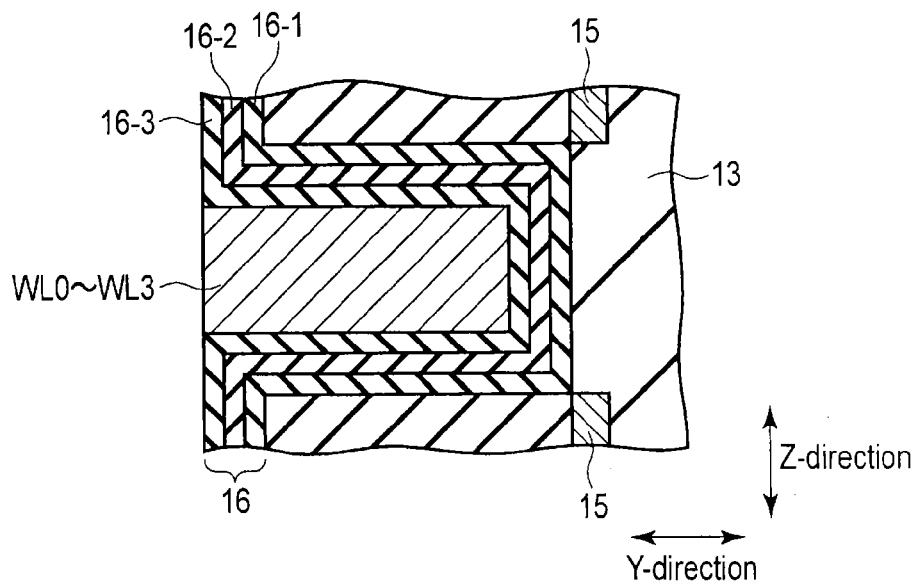
FIG. 6 is a cross-sectional view showing an example of a gate insulating layer structure.

As shown in, for example, FIG. 6, the second stacked structure 16 is provided on a side surface of the oxide semiconductor layer 13, and comprises gate insulating layer 16-1 surrounding the oxide semiconductor layer 13, charge accumulating layer 16-2 provided on gate insulating layer 16-1 to surround the same, and block insulating layer 16-3 provided on charge accumulating insulating layer 16-2 to surround the same.

However, the insulating layers between select gate lines SGL0 and SGL1 and the oxide semiconductor layers 13 may have a structure (for example, a single-layer structure) with no charge accumulating layer.

An interlayer insulating layer 17 fills the space between the adjacent first stacked structures S1. An interlayer insulating layer 18 is provided on first stacked structures S1. A bit line (conductive line) BL is provided on the interlayer insulating layer 18 and is connected to the second ends (upper surfaces) of the oxide semiconductor layers 13 via contact plugs 19. In the first embodiment, the bit line BL extends in the Y direction.

A description will be given of examples of materials.

The source line SL, select gate lines SGL0 and SGL1 and word lines WL1, WL2, WL3 and WL4 comprise, for example, polysilicon containing an impurity. The bit line BL and the contact plugs 19 comprise, for example, W (tungsten).

The source line SL, select gate lines SGL0 and SGL1, word lines WL1, WL2, WL3 and WL4, the bit line BL and the contact plugs 19 may comprise, for example, a metal compound, such as tantalum nitride (TaN), tantalum carbide (TaC), titanium nitride (TiN), or comprise Ni, V, Cr, Mn, Y, Mo, Ru, Rh, Hf, Ta, W, Ir, Co, Ti, Er, Pt, Pd, Zr, Gd, Dy, Ho, that exhibit a metallic electric conducting property, or a silicide of them.

Gate insulating layer 16-1 comprises, for example, $SiO_2$. Gate insulating layer 16-1 may comprise a stacked structure of silicon oxynitride, silicon oxide and silicon nitride.

Charge accumulating layer 16-2 comprises, for example, $Si_3N_4$. Charge accumulating layer 16-2 may comprise, for example, a silicon-rich silicon nitride, $Si_x N_y$, wherein the composition ratio of x and y is arbitrary, silicon oxynitride (SiON), aluminum oxide ($Al_2O_3$), aluminum oxynitride (AlON), hafnia ($HfO_2$), hafnium aluminate (HfAlO$_3$), hafnia nitride (HfON), hafnium nitride aluminate (HfAlON), hafnium silicate (HfSiO), hafnium nitride silicate (HfSiON), lanthanum oxide ($La_2O_3$), or lanthanum aluminate ($LaAlO_3$).

Charge accumulating layer 16-2 may comprise, for example, silicon nanoparticles or metal ions, or comprise a conductor, such as polysilicon with an impurity added, or a metal.

Block insulating layer 16-3 comprises, for example, $Al_2O_3$. Block insulating layer 16-3 may comprise, for example, aluminum oxynitride (AlON), hafnia ($HfO_2$), hafnium aluminate (HfAlO$_3$), hafnia nitride (HfON), hafnium nitride, hafnium nitride aluminate (HfAlON), lanthanum oxide ($La_2O_3$), lanthanum aluminate (LaAlO$_3$), or lanthanum aluminum silicate (LaAlSiO).

The oxide semiconductor layers 13 comprise, for example, an oxide compound containing In, Ga and Zn, such as an InGaZn oxide (e.g., InGaZnO$_4$). The oxide semiconductor layers 13 may comprise an oxide compound containing an element selected from a group consisting of In, Ga, Zn and Sn, such as InGaO, InSnO, InZnO, ZnSnO or InSnZnO.

The interlayer insulating layers 14 comprise a material that can deoxidize the oxide semiconductor layers 13, namely comprise, for example, silicon-rich silicon oxide layers or hydrogen-rich insulating layers (alumina). The interlayer insulating layers 12, 17 and 18 comprise, for example, a stoichiometric silicon oxide ($SiO_2$).

2. Second Embodiment

Figure 7:
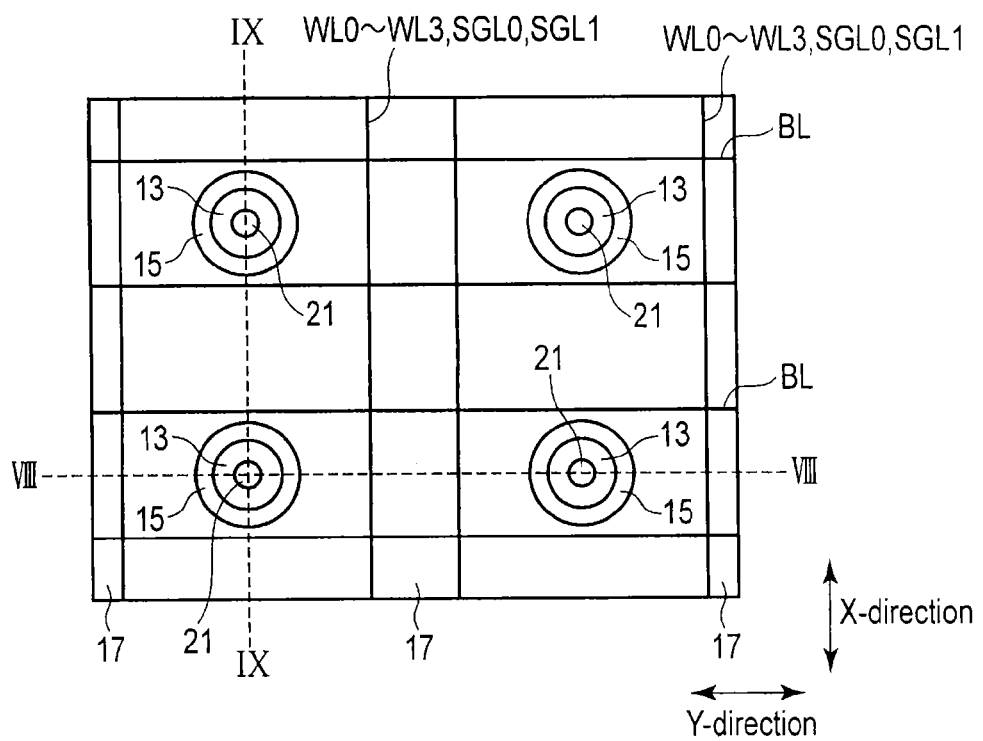
FIG. 7 is a plan view showing a nonvolatile semiconductor memory device according to a second embodiment.
Figure 8:
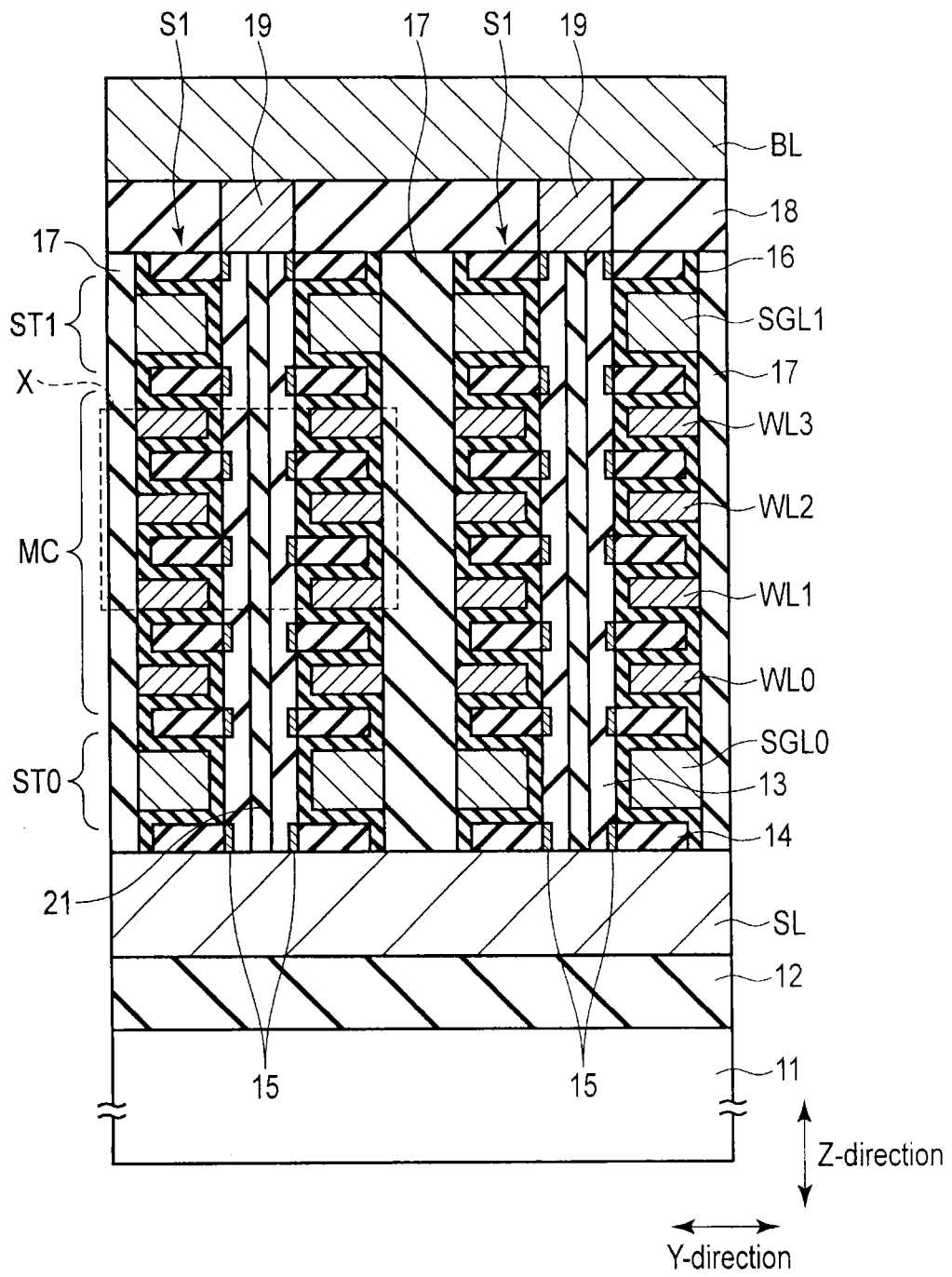
FIG. 8 is a cross-sectional view taken along line VIII-VIII of FIG. 7.

FIG. 7 shows a nonvolatile semiconductor memory device according to a second embodiment. FIG. 8 is a cross-sectional view taken along line VIII-VIII of FIG. 7, and FIG. 9 is a cross-sectional view taken along line IX-IX of FIG. 7.

The second embodiment differs from the first embodiment in that in the former, the oxide semiconductor layer 13 is provided around a core layer 21 extending in the Z direction. The second embodiment is similar to the first embodiment in the other points. In the second embodiment, elements similar to those of the first embodiment are denoted by corresponding reference numbers, and no detailed description will be given thereof.

The core layer 21 comprises, for example, $SiO_2$. The core layer 21 has a cylindrical shape. The oxide semiconductor layer 13 is provided around the core layer 21.

In this structure, select transistors ST0 and ST1 and memory cells MC are formed on a channel layer of a so-called silicon on insulator (SOI) structure. Accordingly, high-speed operation due to reduction of parasitic capacitance can be realized.

3. Modifications

Modifications of the above-described first and second embodiments will be described.

Although in the first and second embodiments (FIGS. 1 to 9), all interlayer insulating layers (first to seventh insulating layers) 14 are silicon-rich silicon oxide layers or hydrogen-rich insulating layers, in the modifications, at least one of the interlayer insulating layers (first to seventh insulating layers) 14 may be a silicon-rich silicon oxide layer or a hydrogen-rich insulating layer.

In this case, the interlayer insulating layers other than the silicon-rich silicon oxide layer or hydrogen-rich insulating layer are stoichiometric interlayer insulating layers (formed of, for example, $SiO_2$). Further, low-resistance areas 15 are provided in the oxide semiconductor layer 13 that contact at least one of the interlayer insulating layers (first to seventh insulating layers) 14.

Figure 10:
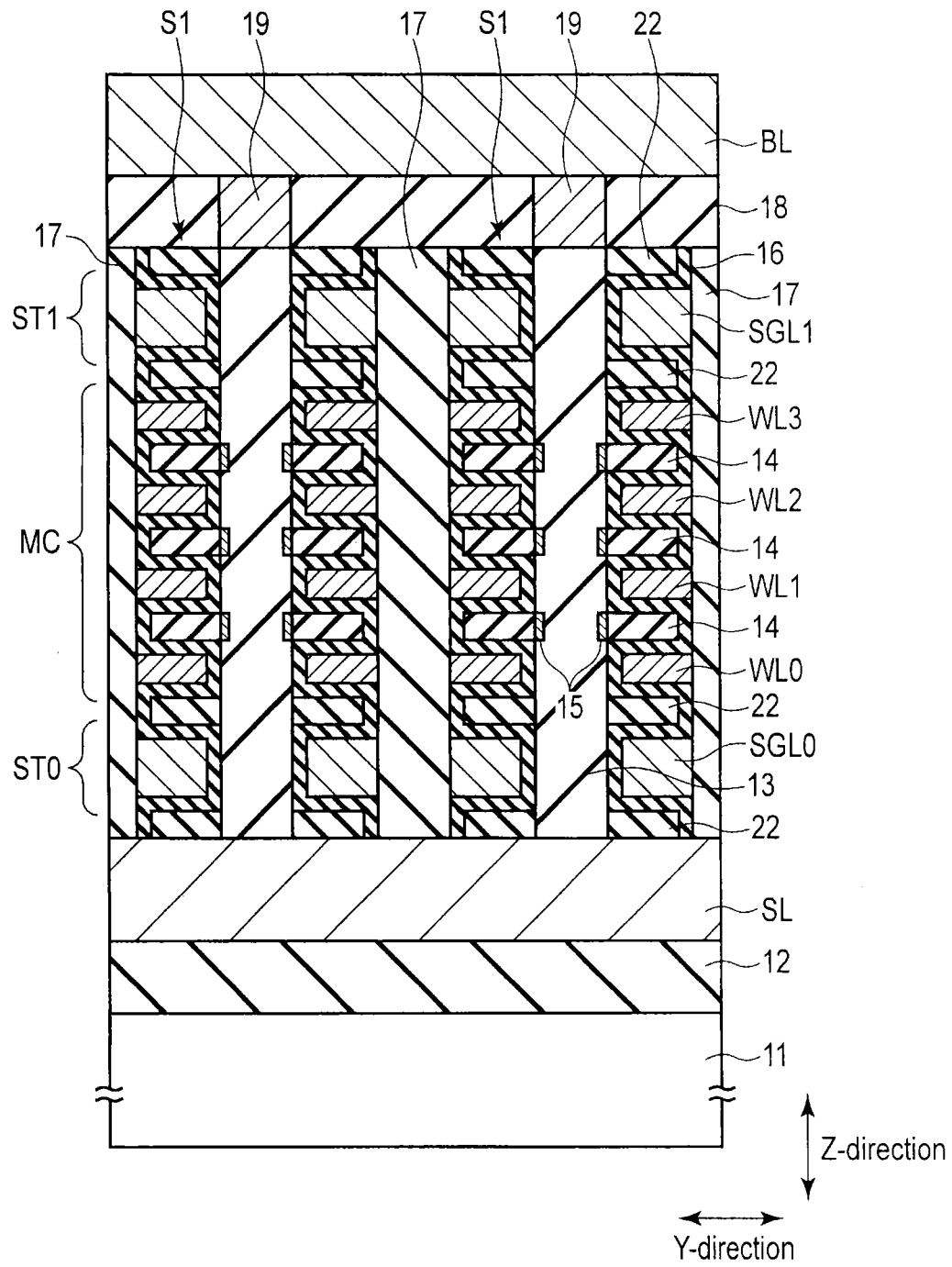
FIGS. 10 and 11 are cross-sectional views showing a first modification.
Figure 11:
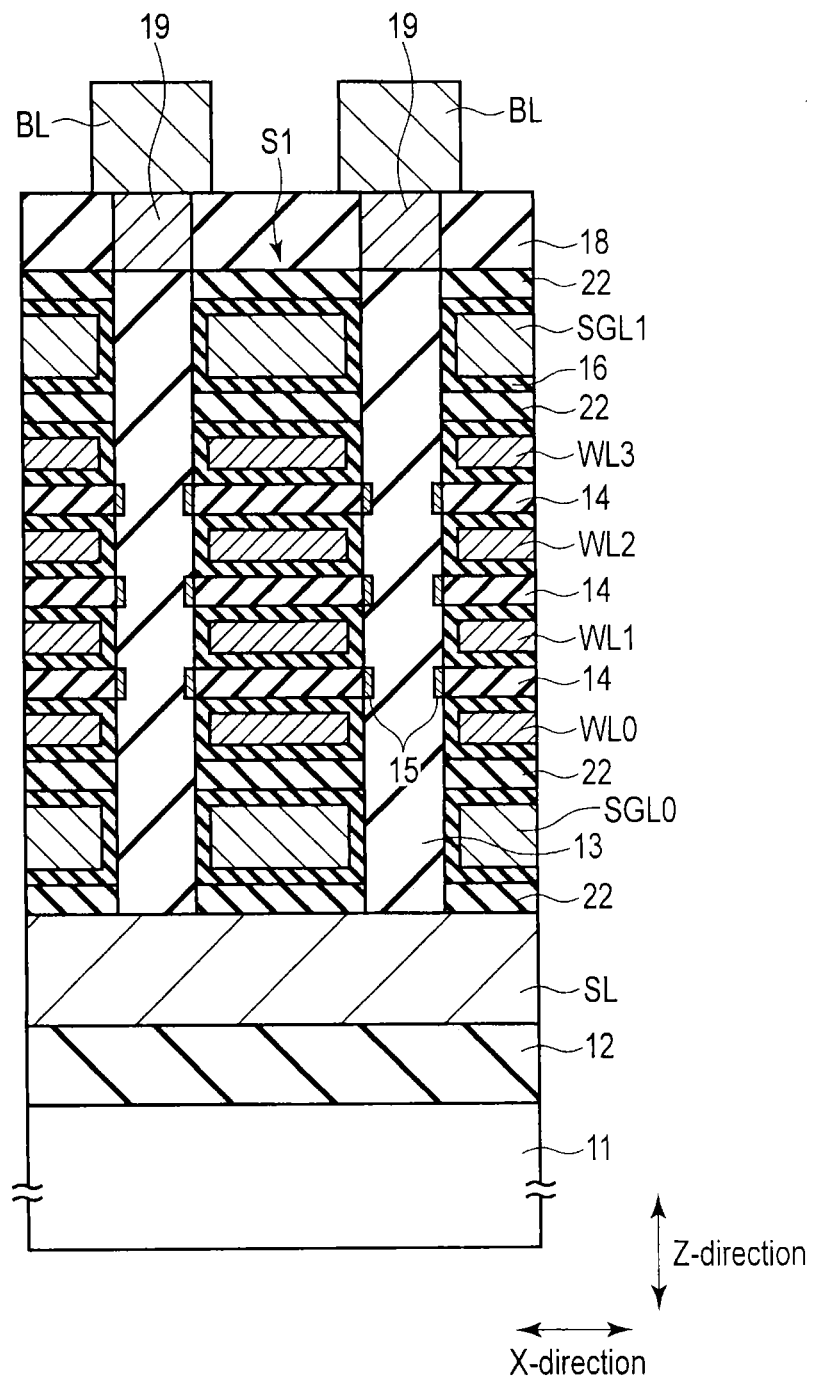

FIGS. 10 and 11 show a first modification.

FIGS. 10 and 11 correspond to FIGS. 2 and 3 directed to the first embodiment, and to FIGS. 8 and 9 directed to the second embodiment.

In the first modification, the first stacked structure S1 is constructed such that in the Z direction perpendicular to the surface of the semiconductor substrate 11, a first insulating layer 22, first electrode layer (select gate line) SGL0, a second insulating layer 22, second electrode layer (word line) WL0, a third insulating layer 14, third electrode layer (word line) WL1, a fourth insulating layer 14, fourth electrode layer (word line) WL2, a fifth insulating layer 14, a sixth insulating layer 22, sixth electrode layer (select gate line) SGL1 and a seventh insulating layer 22 are stacked in the order mentioned.

The first, second, sixth and seventh insulating layers 22 each comprise, for example, a stoichiometric silicon oxide layer (formed of $SiO_2$). The third, fourth and fifth insulating layers 14 comprise a material that can deoxidize the oxide semiconductor layers 13, namely comprise, for example, silicon-rich silicon oxide layers or hydrogen-rich insulating layers (alumina).

In this case, the low-resistance areas 15 are provided in the oxide semiconductor layer 13 that contact the third, fourth and fifth interlayer insulating layers 14.

The structure of this modification is effective, in particular, to reduce the resistance of memory cells MC connected in series.

Figure 12:
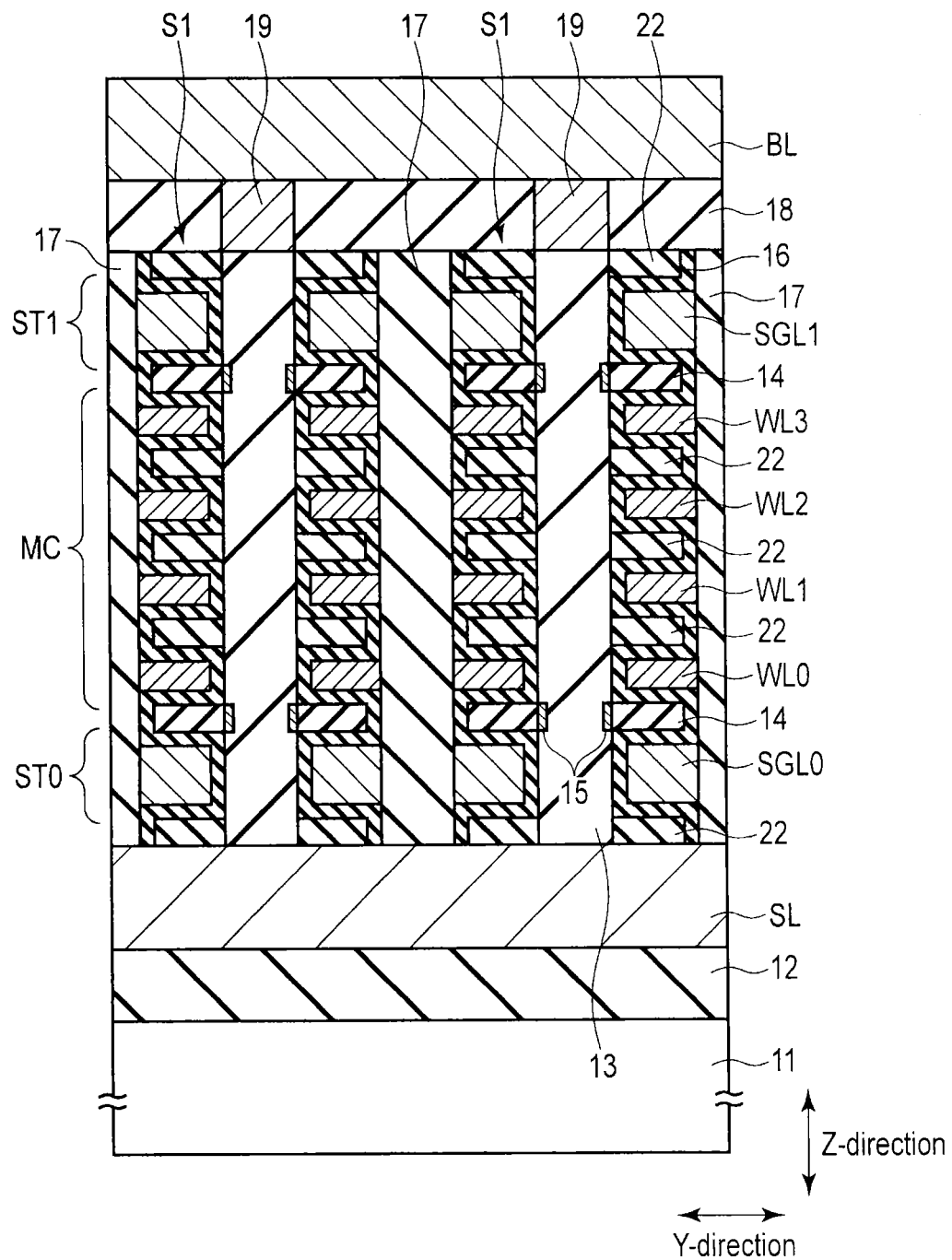
FIGS. 12 and 13 are cross-sectional views showing a second modification.
Figure 13:
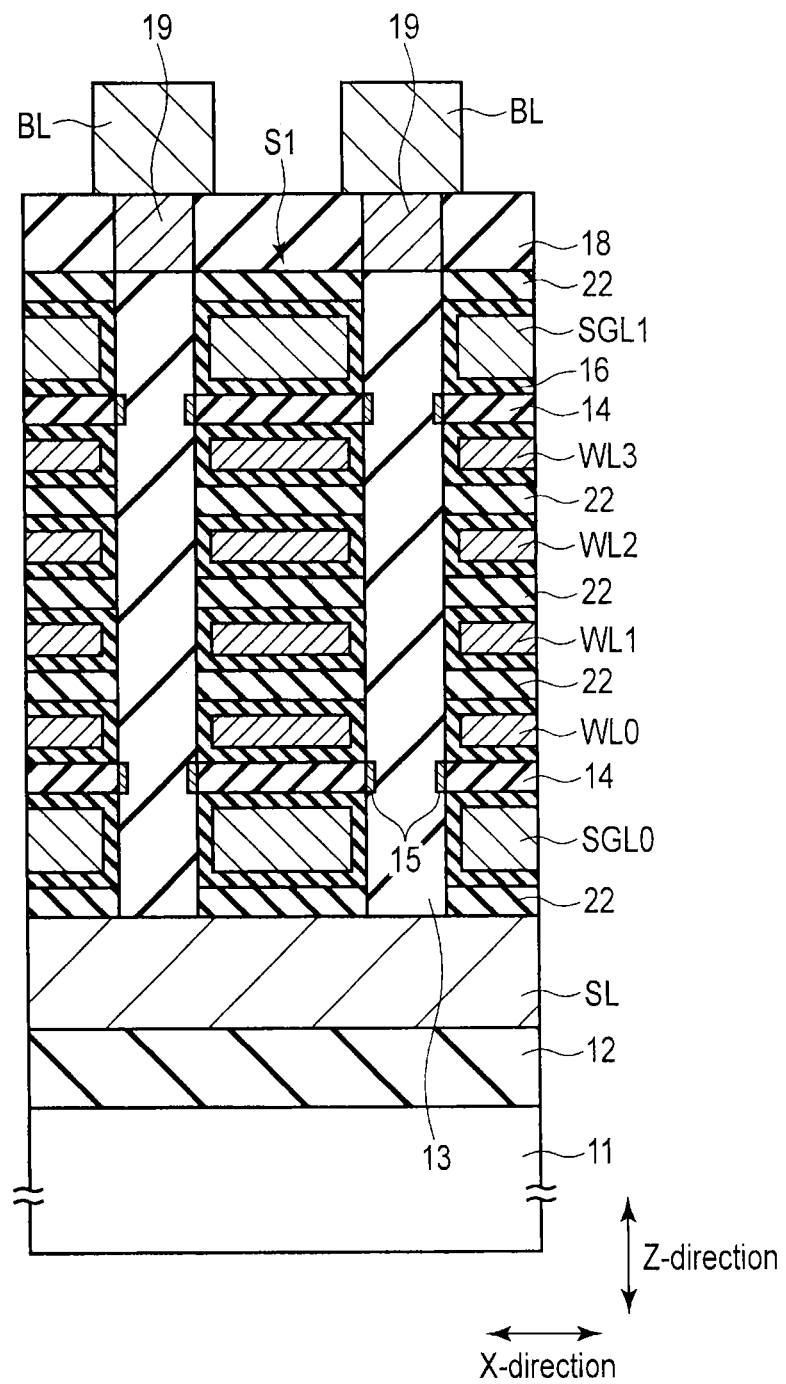

FIGS. 12 and 13 show a second modification.

FIGS. 12 and 13 correspond to FIGS. 2 and 3 directed to the first embodiment, and to FIGS. 8 and 9 directed to the second embodiment.

In the second modification, the first stacked structure S1 is constructed such that in the Z direction perpendicular to the surface of the semiconductor substrate 11, a first insulating layer 22, first electrode layer (select gate line) SGL0, second electrode layer (word line) WL0, a third insulating layer 22, third electrode layer (word line) WL1, a fourth insulating layer 22, fourth electrode layer (word line) WL2, a fifth insulating layer 22, fifth electrode layer (word line) WL3, a sixth insulating layer 14, sixth electrode layer (select gate line) SGL1 and a seventh insulating layer 22 are stacked in the order mentioned.

The first, third, fourth, fifth and seventh insulating layers 22 each comprise, for example, a stoichiometric silicon oxide layer (formed of $SiO_2$). The second and sixth insulating layers 14 comprise a material that can deoxidize the oxide semiconductor layers 13, namely comprise, for example, silicon-rich silicon oxide layers or hydrogen-rich insulating layers (alumina).

In this case, the low-resistance areas 15 are provided in the oxide semiconductor layer 13 that contact the second and sixth interlayer insulating layers 14.

The structure of the second modification is effective, in particular, to reduce the resistances between select transistors ST0 and ST1 and memory cells MC connected in series.

FIGS. 14 and 15 show a third modification.

FIGS. 14 and 15 correspond to FIGS. 2 and 3 directed to the first embodiment, and to FIGS. 8 and 9 directed to the second embodiment.

In the third modification, the first stacked structure S1 is constructed such that in the Z direction perpendicular to the surface of the semiconductor substrate 11, a first insulating layer 14, first electrode layer (select gate line) SGL0, a second insulating layer 22, second electrode layer (word line) WL0, a third insulating layer 22, third electrode layer (word line) WL1, a fourth insulating layer 22, fourth electrode layer (word line) WL2, a fifth insulating layer 22, fifth electrode layer (word line) WL3, a sixth insulating layer 22, sixth electrode layer (select gate line) SGL1 and a seventh insulating layer 14 are stacked in the order mentioned.

The second, third, fourth, fifth and sixth insulating layers 22 each comprise, for example, a stoichiometric silicon oxide layer (formed of $SiO_2$). The first and seventh insulating layers 14 comprise a material that can deoxidize the oxide semiconductor layers 13, namely comprise, for example, silicon-rich silicon oxide layers or hydrogen-rich insulating layers (alumina).

In this case, the low-resistance areas 15 are provided in the oxide semiconductor layer 13 that contact the first and seventh interlayer insulating layers 14.

The structure of the third modification is effective, in particular, to reduce the resistance between select transistor ST0 and the source line SL, and the resistance between select transistor ST1 and the bit line BL.

4. Manufacturing Method

A description will now be given of a method of manufacturing the nonvolatile semiconductor memory device shown in FIGS. 1 to 15.

Firstly, as shown in FIGS. 16 to 21, an insulating layer 12 is formed on, for example, a p-type silicon substrate having (100)-plane orientation and a specific resistance of 10 to 20 Ωcm. On the insulating layer 12, a source line SL is formed.

The source line SL is formed by, for example, implanting an impurity into a polysilicon layer by ion implantation and then performing thermal treatment for activating the impurity. The impurity may be an n-type impurity (such as phosphor or arsenic), a p-type impurity (such as boron or indium), or a combination of them.

To form, for example, the structures of the first and second embodiments (shown in FIGS. 1 to 9 except for FIG. 5), a first stacked structure S1 is formed by stacking a first insulating layer 14, a first dummy layer 31, a second insulating layer 14, a second dummy layer 31, ..., a sixth insulating layer 14, a sixth dummy layer 31 and a seventh insulating layer 14 in the order mentioned in the Z direction perpendicular to the surface of the semiconductor substrate 11, as is shown in FIGS. 16 and 17.

Further, to form the structure of a modification (shown in FIG. 5) of the first and second embodiments, a first stacked structure S1 is formed by stacking first insulating layers 20, 14 and 20, a first dummy layer 31, second insulating layers 20, 14 and 20, a second dummy layer 31, ..., sixth insulating layers 20, 14 and 20, a sixth dummy layer 31 and seventh insulating layers 20, 14 and 20 in the order mentioned in the Z direction perpendicular to the surface of the semiconductor substrate 11, as is shown in FIGS. 18 and 19.

Figure 20:
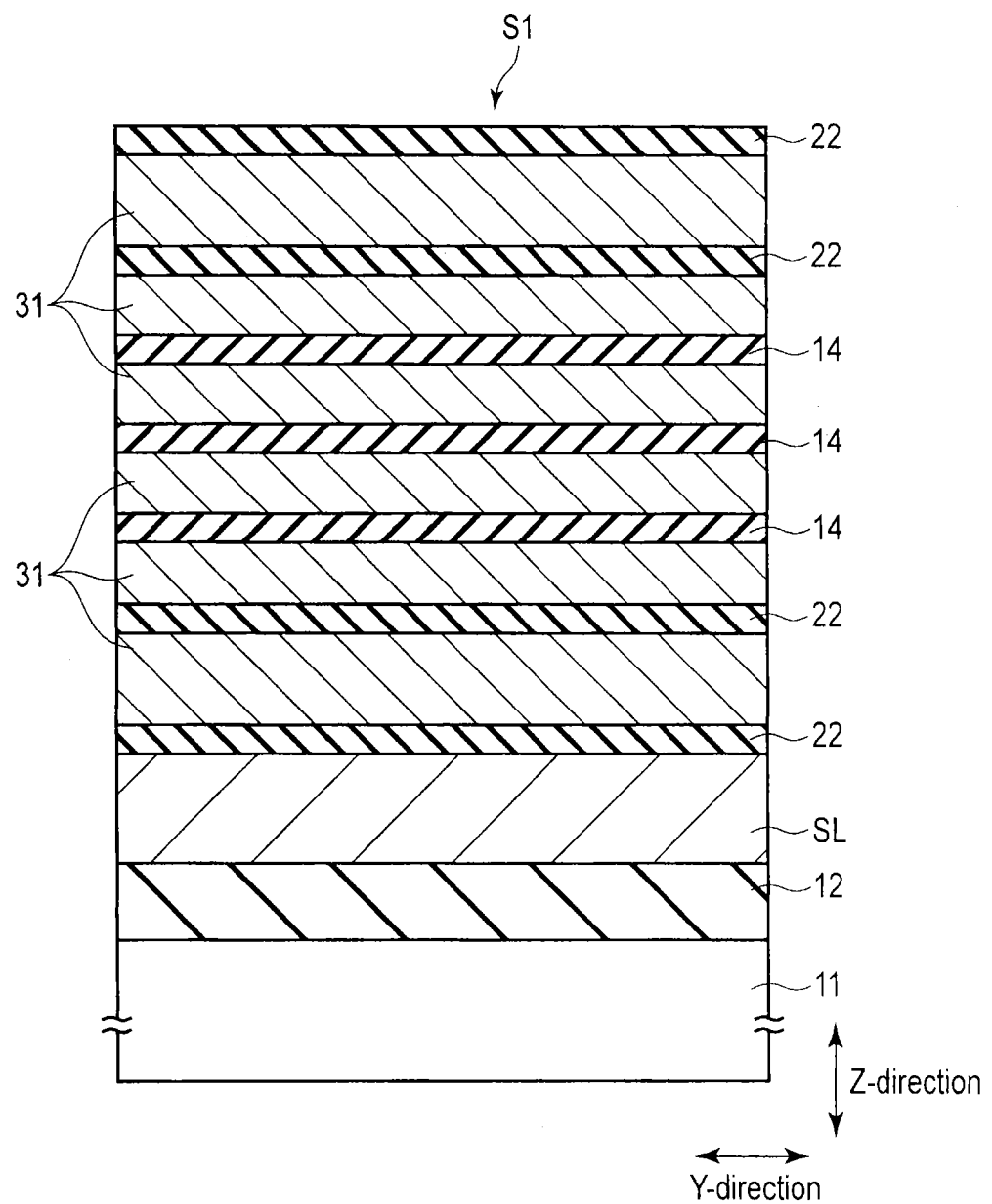
Figure 21:
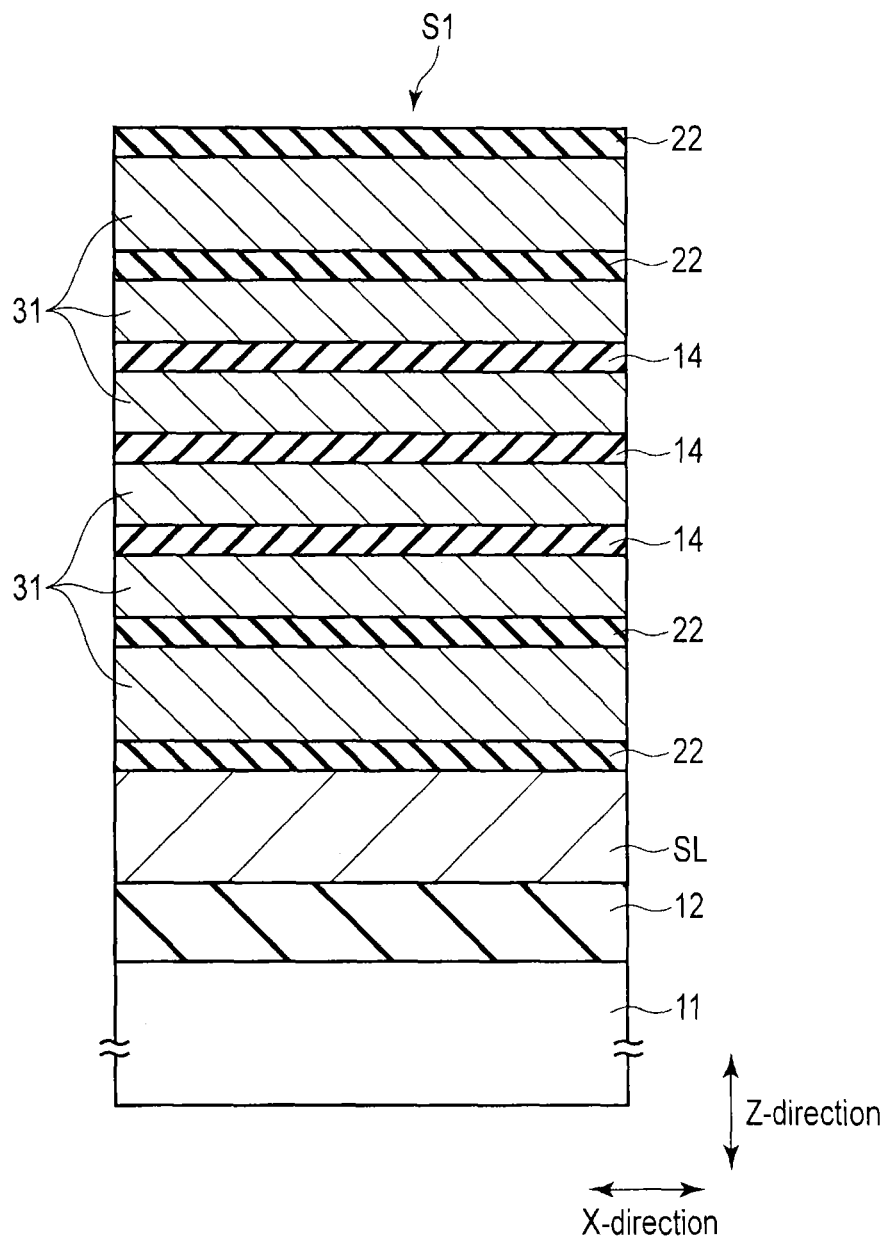

Yet further, to form the structures of the first to third modifications (shown in FIGS. 10 to 15) (a description will now be given only of the structure shown in FIGS. 10 and 11), a first stacked structure S1 is formed by stacking a first insulating layer 22, a first dummy layer 31, a second insulating layer 22, a second dummy layer 31, ..., a third insulating layer 14, a third dummy layer 31, a fourth insulating layer 14, a fourth dummy layer 31, a fifth insulating layer 14, a fifth dummy layer 31, a sixth insulating layer 22, a sixth dummy layer 31 and a seventh insulating layer 22 in the order mentioned in the Z direction perpendicular to the surface of the semiconductor substrate 11, as is shown in FIGS. 20 and 21.

The dummy layers 31 are, for example, silicon nitride layers.

The structure shown in FIGS. 16 and 17 will now be described mainly.

Figure 23:
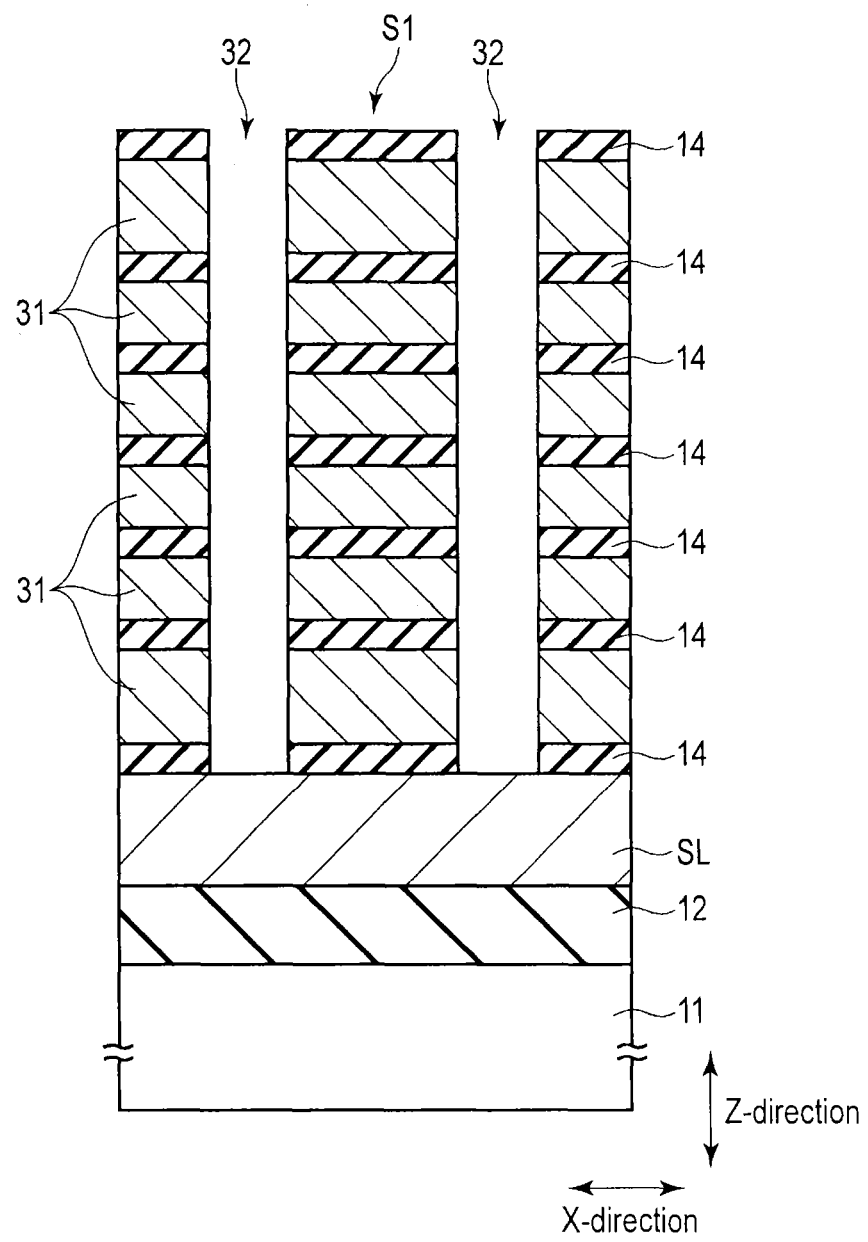

After the above-described process, through-holes 32 reaching the source line SL are formed in the first stacked structure by, for example, photo engraving process (PEP) and anisotropic etching, as is shown in FIGS. 22 and 23. Subsequently, the through-holes 32 are filled with dummy semiconductor layers (channel layers). The part of the dummy semiconductor layers existing outside the through-holes 32 are eliminated by, for example, chemical mechanical polishing (CMP).

Figure 24:
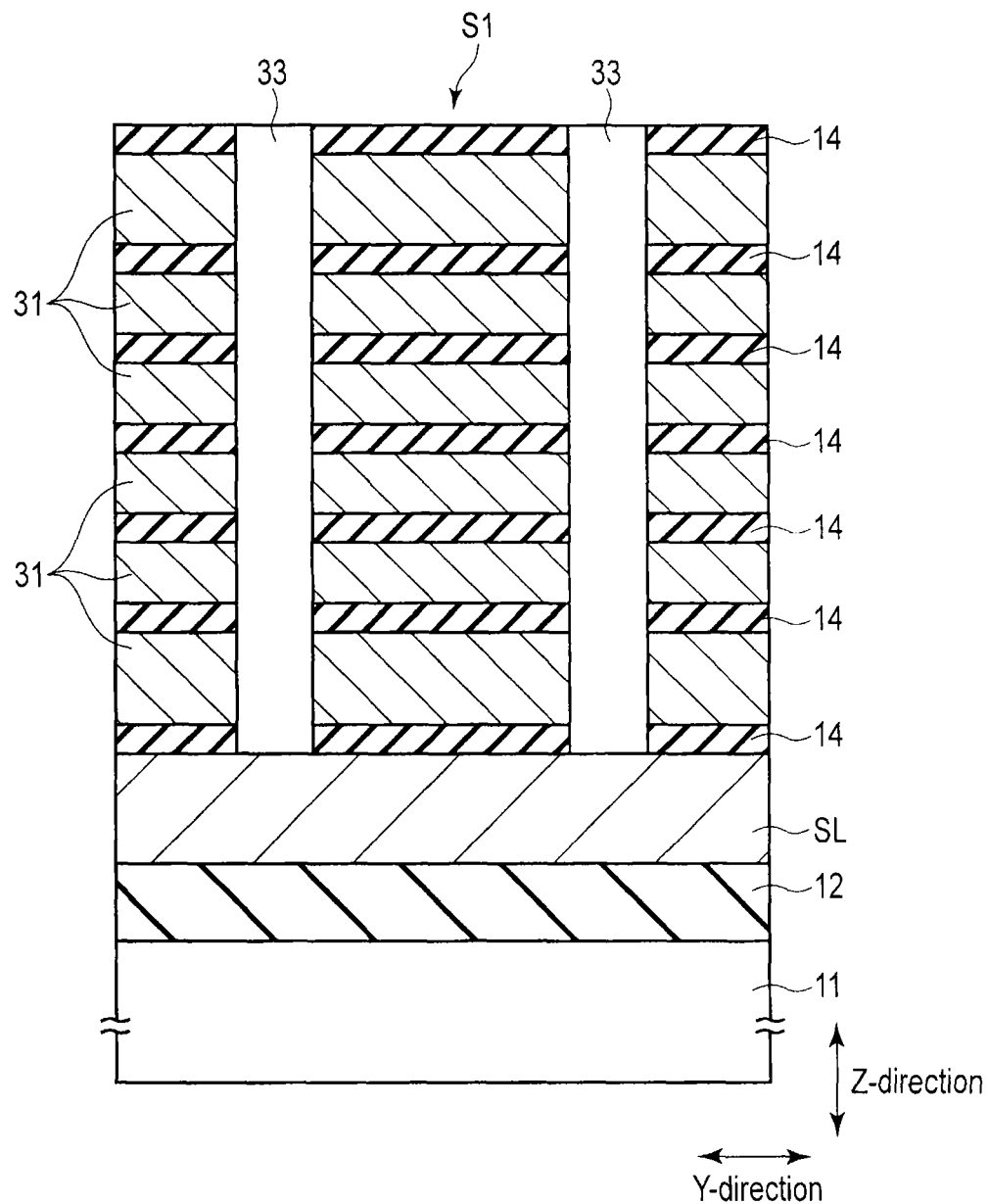

As a result, dummy semiconductor layers 33 extending through the first stacked structure S1 and connected to the source line SL are formed in the Z direction, as is shown in FIGS. 24 and 25.

The dummy semiconductor layers 33 are, for example, SiGe layers.

Figure 26:
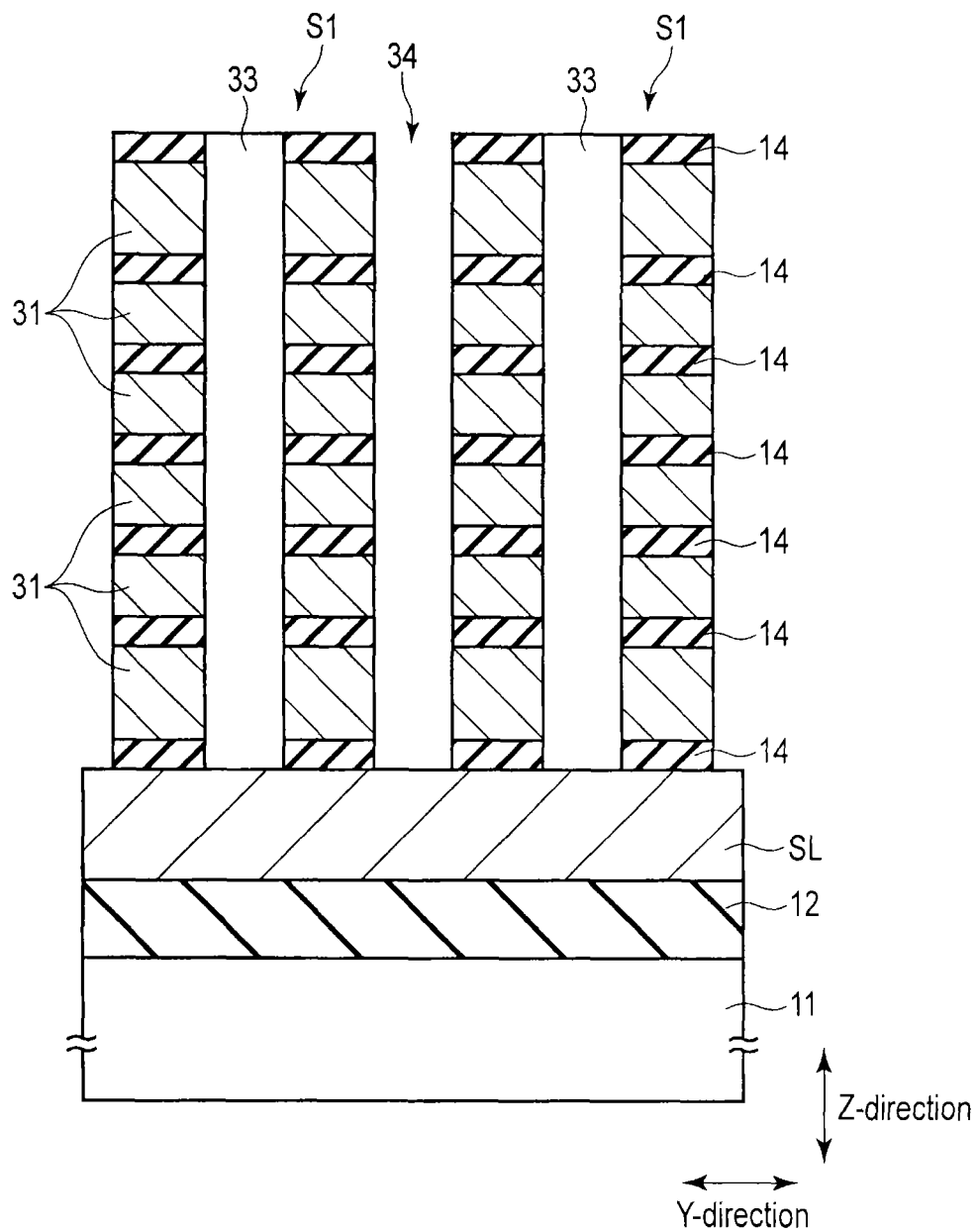
Figure 27:
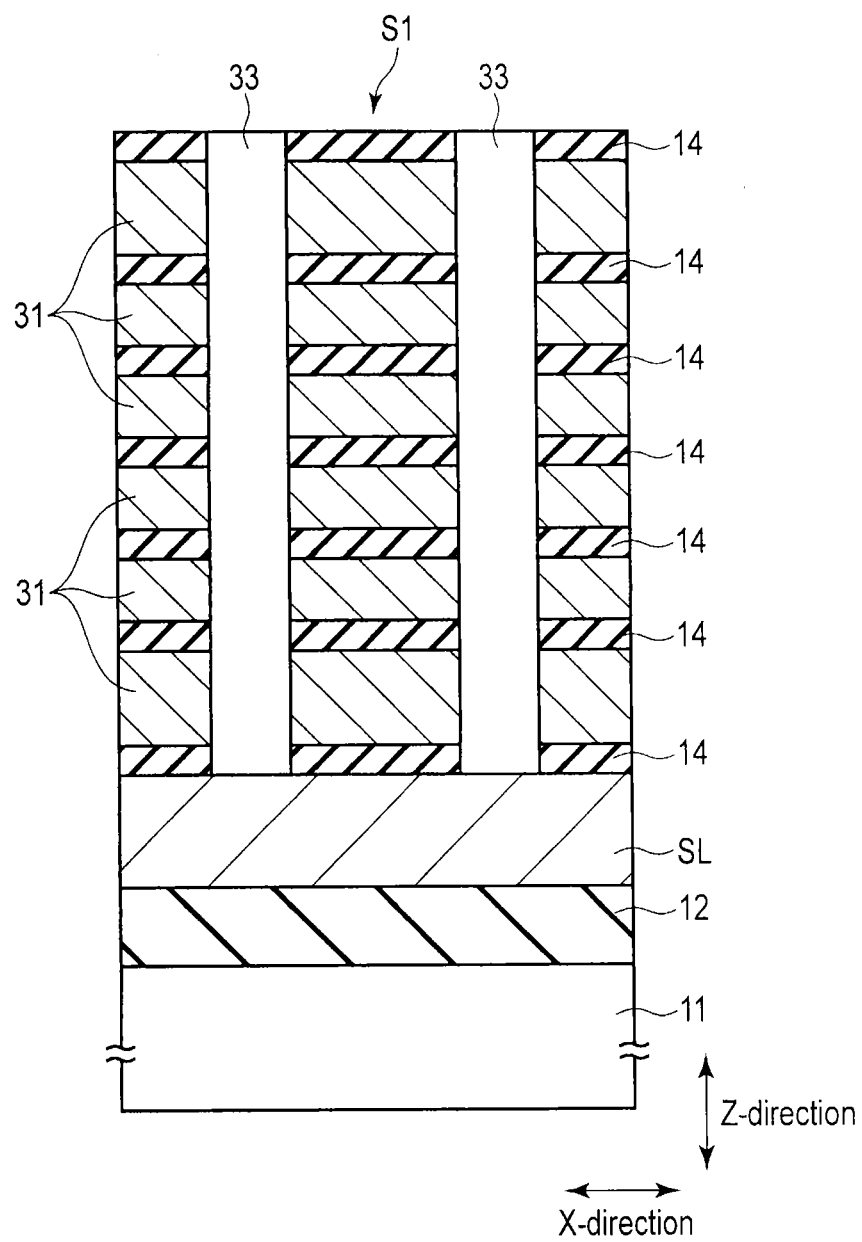

Subsequently, as shown in FIGS. 26 and 27, the first stacked structure S1 is patterned into a line & space pattern extending in the X direction, by, for example, PEP and anisotropic etching. As a result, the line portions of the line & space pattern serve as respective first stacked structures S1, and the space portions serve as grooves 34.

After that, the first to sixth dummy layers 31 are eliminated from the groove 34 by, for example, wet etching using $H_3PO_4$.

Figure 28:
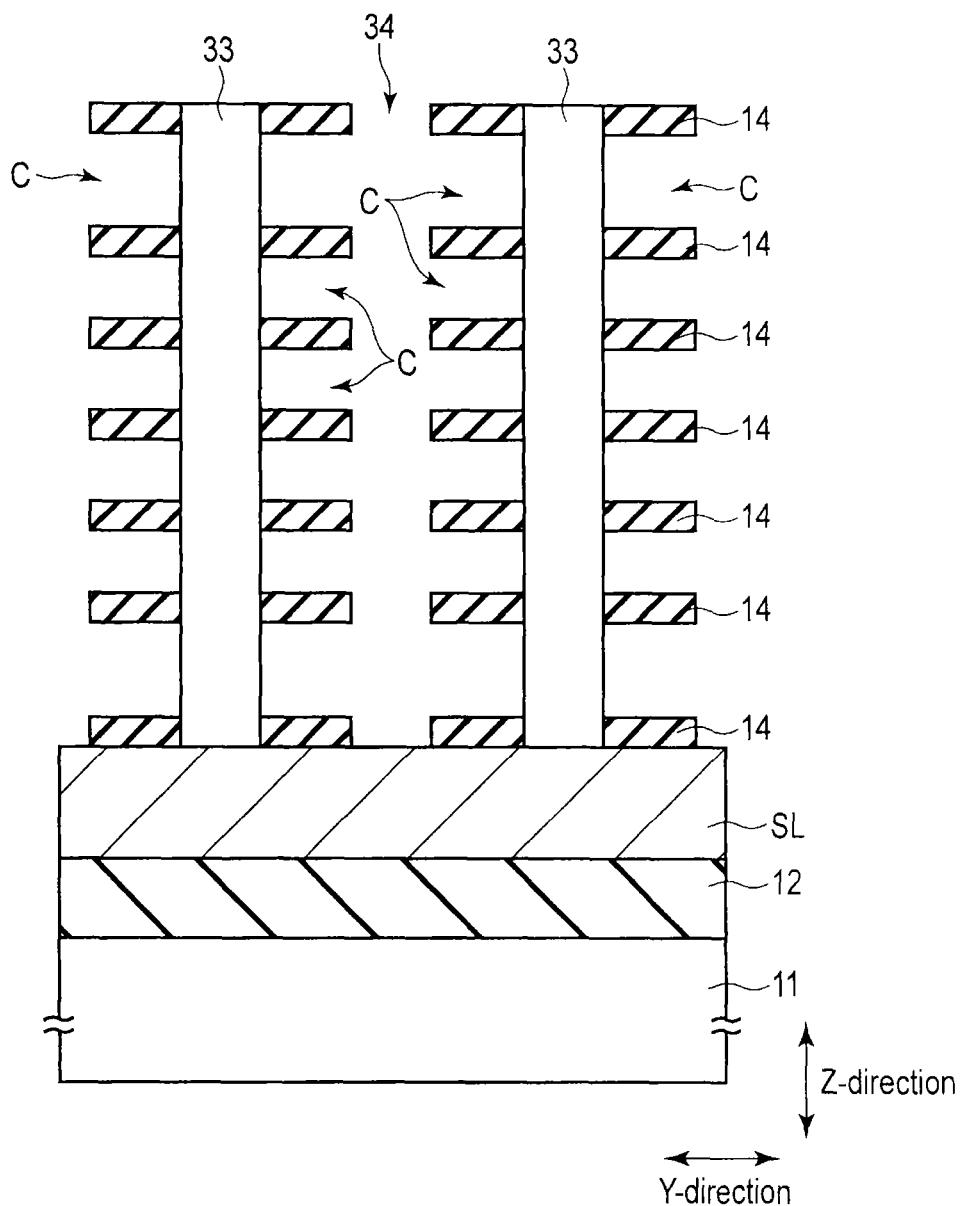
Figure 29:
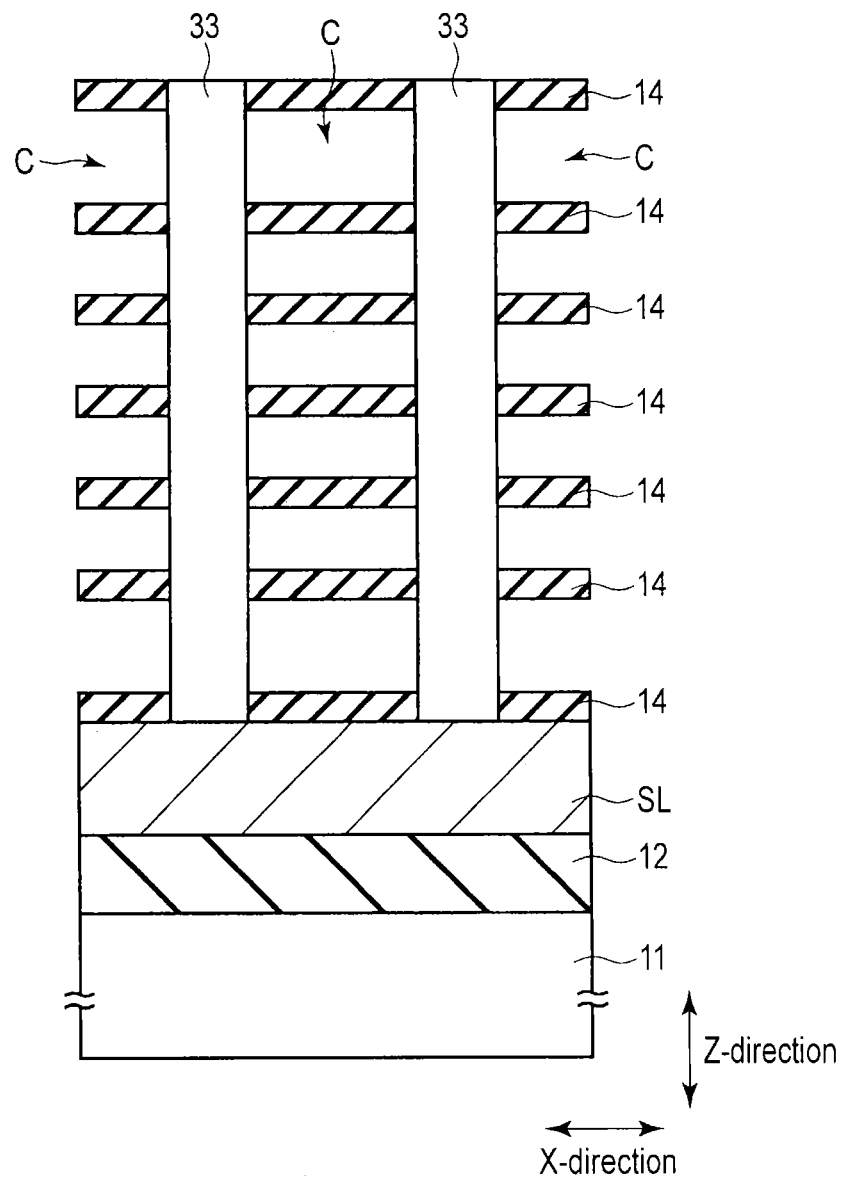

As a result, cavities C are formed between the first to seventh insulating layers 14 as shown in FIGS. 28 and 29.

Figure 31:
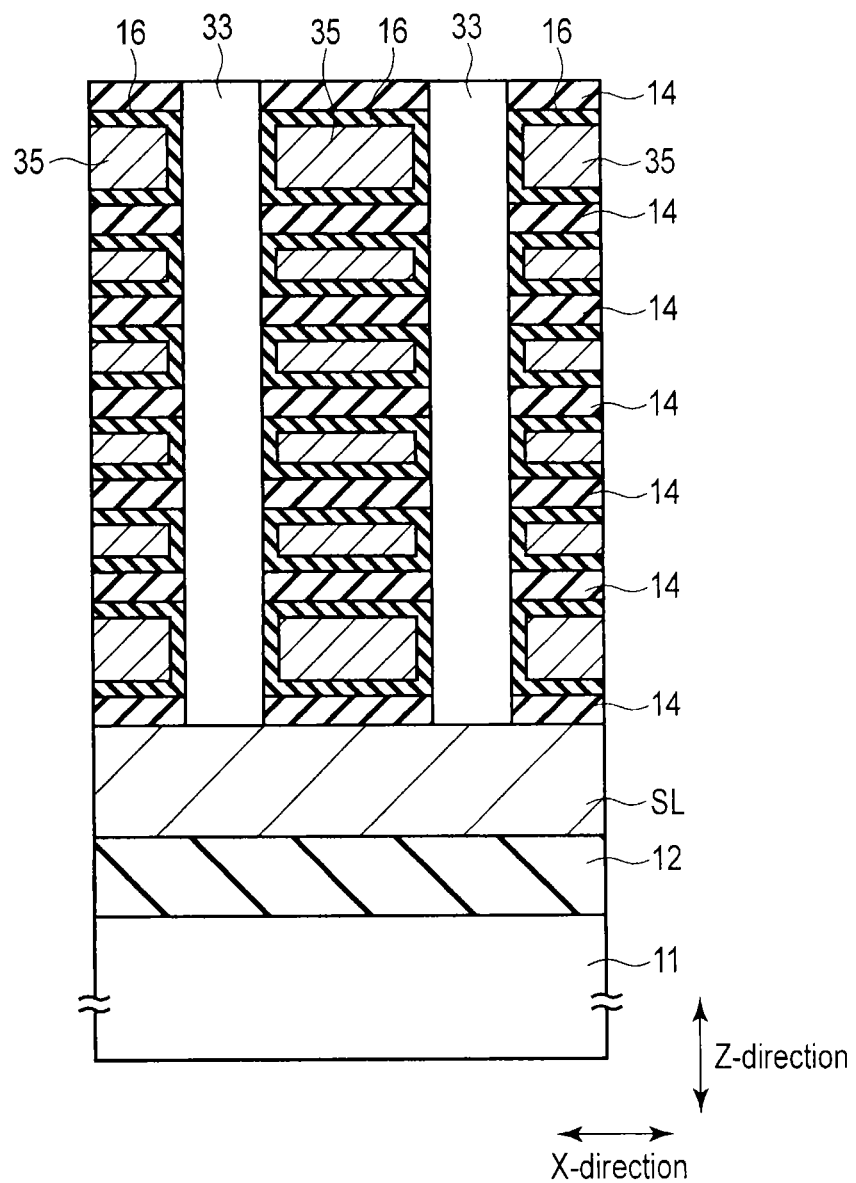

Thereafter, second stacked structures 16 are formed to surround the dummy semiconductor layers 33 exposed in the cavities C, as is shown in FIGS. 30 and 31. As aforementioned, the second stacked structures 16 comprise, for example, charge accumulating layers. For instance, the second stacked structures 16 each comprise gate insulating layer 16-1, charge accumulating layer 16-2 and block insulating layer 16-3 as shown in FIG. 6.

An electrode material 35 is provided to surround the second stacked structures 16 and fill the grooves 34. The part of the electrode material existing outside the cavities C and the grooves 34 is eliminated by, for example, CMP.

Figure 32:
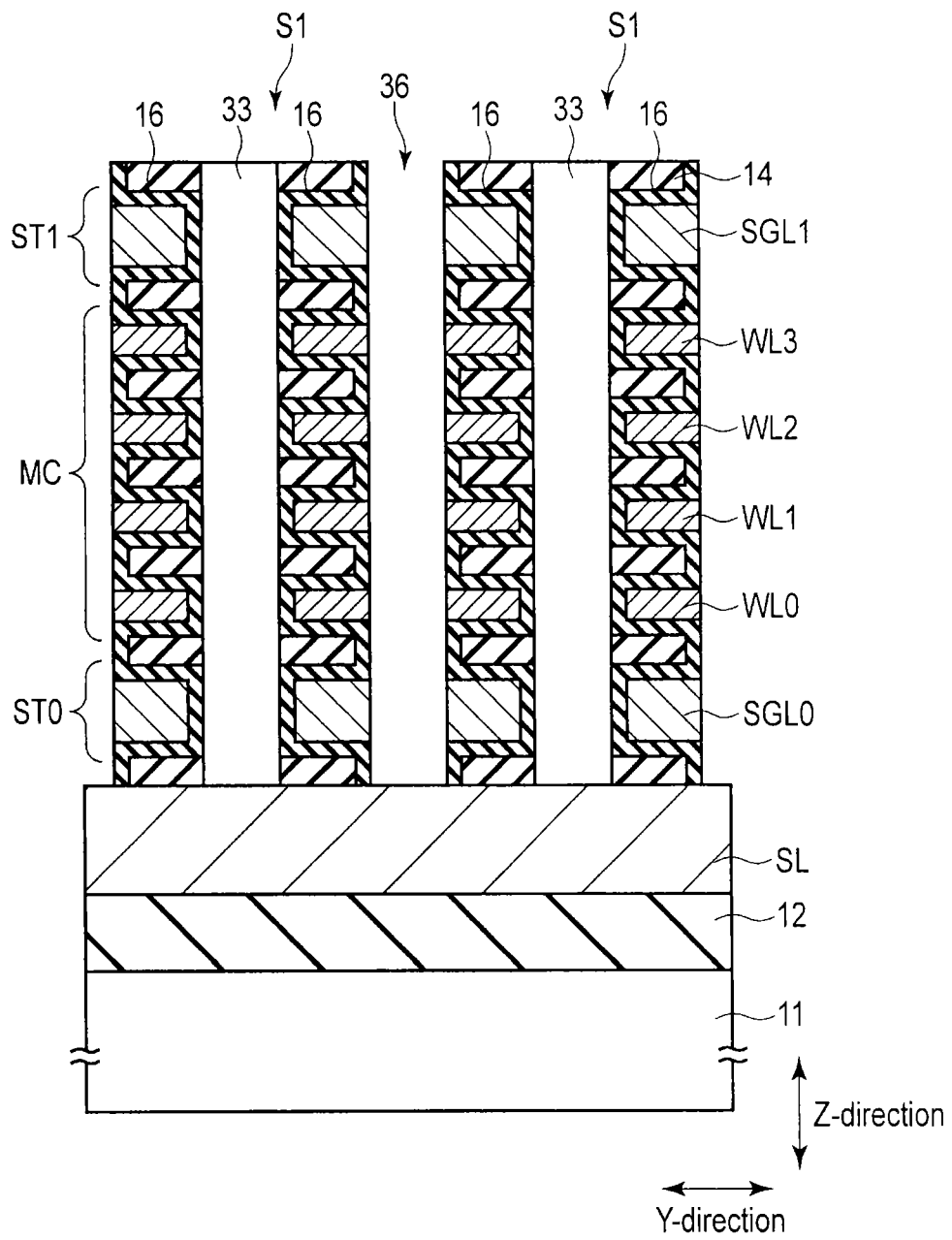
Figure 33:
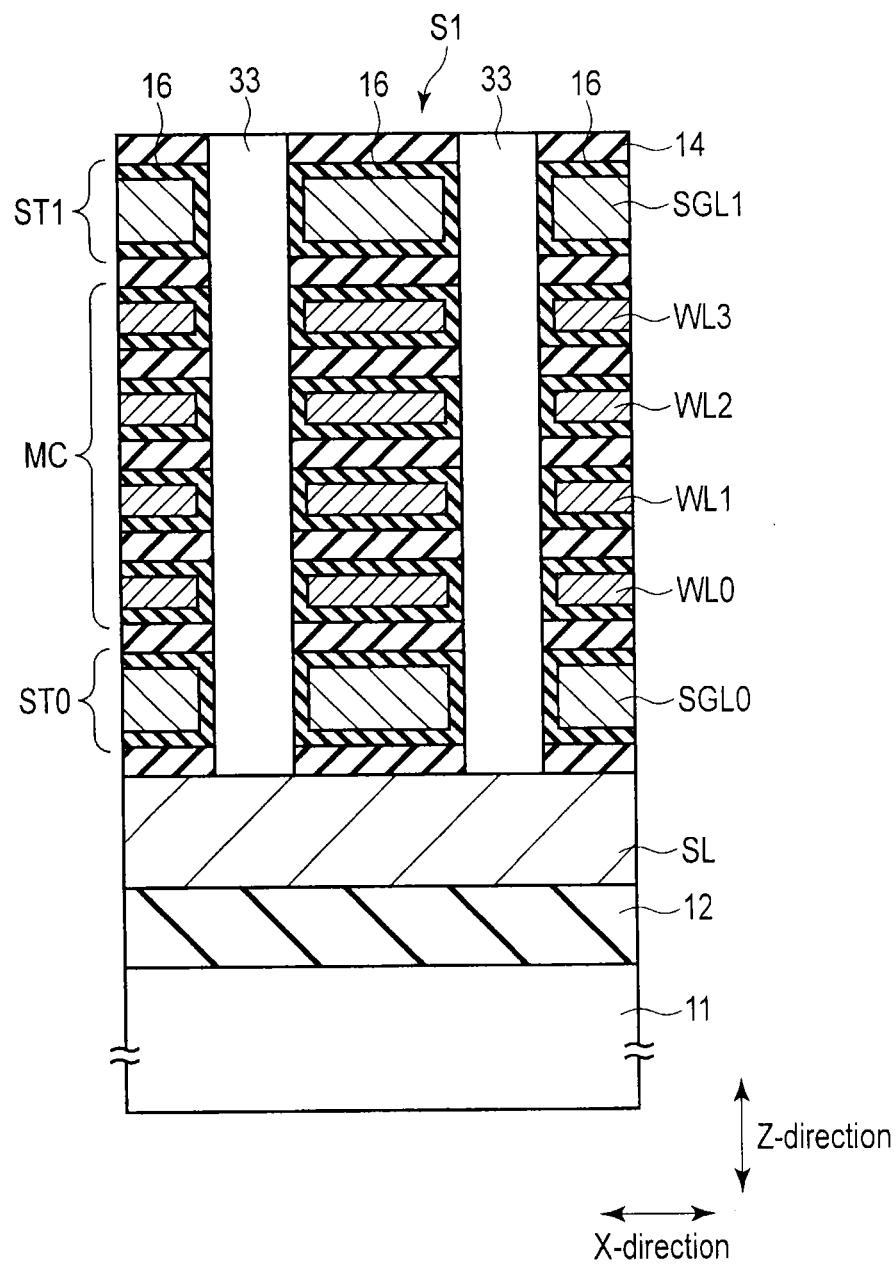

Subsequently, as shown in FIGS. 32 and 33, the electrode material 35 is patterned to form a groove 36 extending in the X direction. As a result, the electrode material 35 is separated between the first to seventh insulating layers 14, thereby forming the gates (select gate lines) SGL0 and SGL1 of a select transistor and the gates (word lines) WL1, WL2, WL3 and WL4 of memory cells MC.

After that, the groove 36 is filled with an insulating layer (formed of, for example, $SiO_2$). The part of the insulating layer existing outside the groove 36 is eliminated by, for example, CMP.

Figure 34:
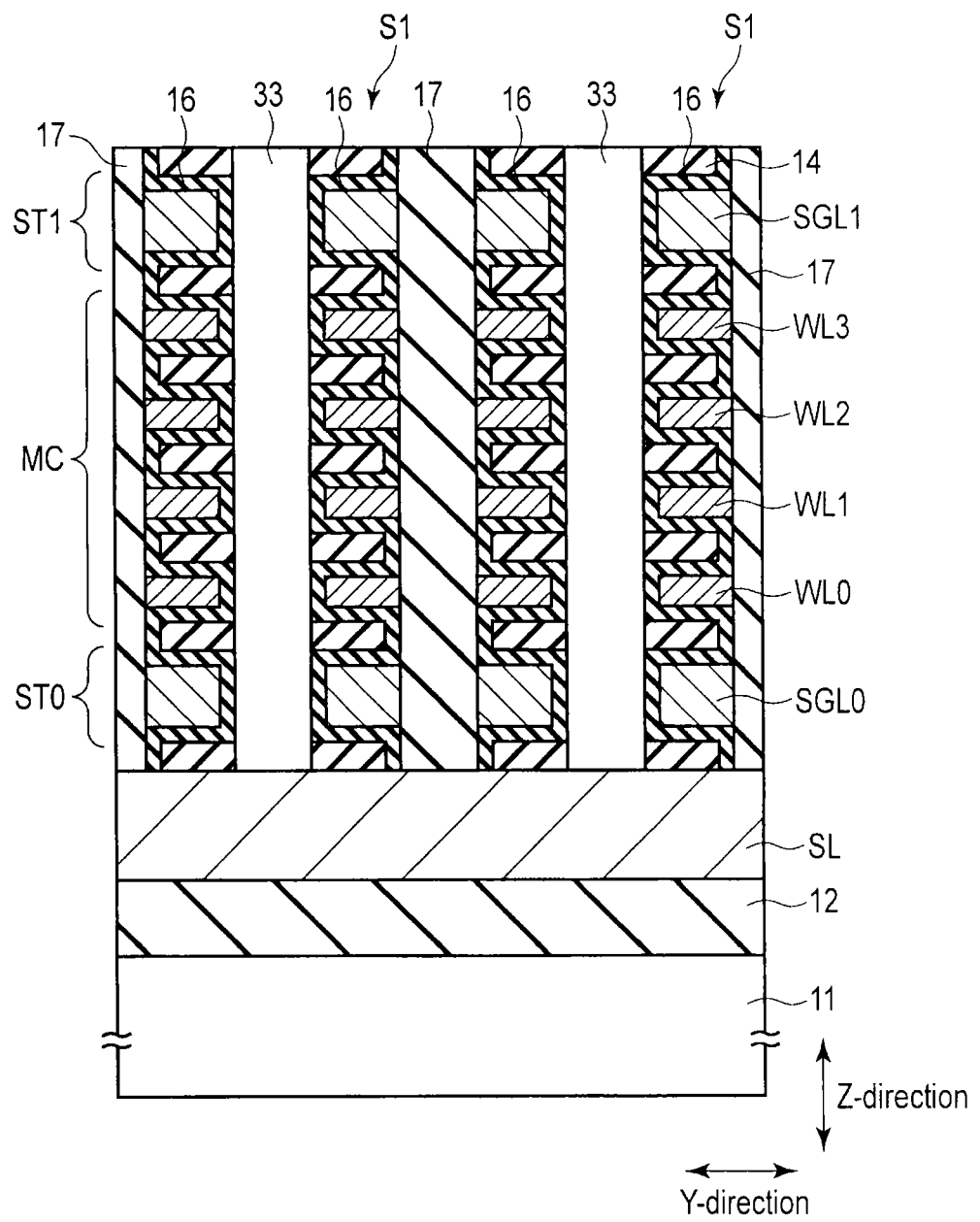

Thus, the space between two first stacked structures S1 is filled with an insulating layer 17 as shown in FIGS. 34 and 35.

Figure 36:
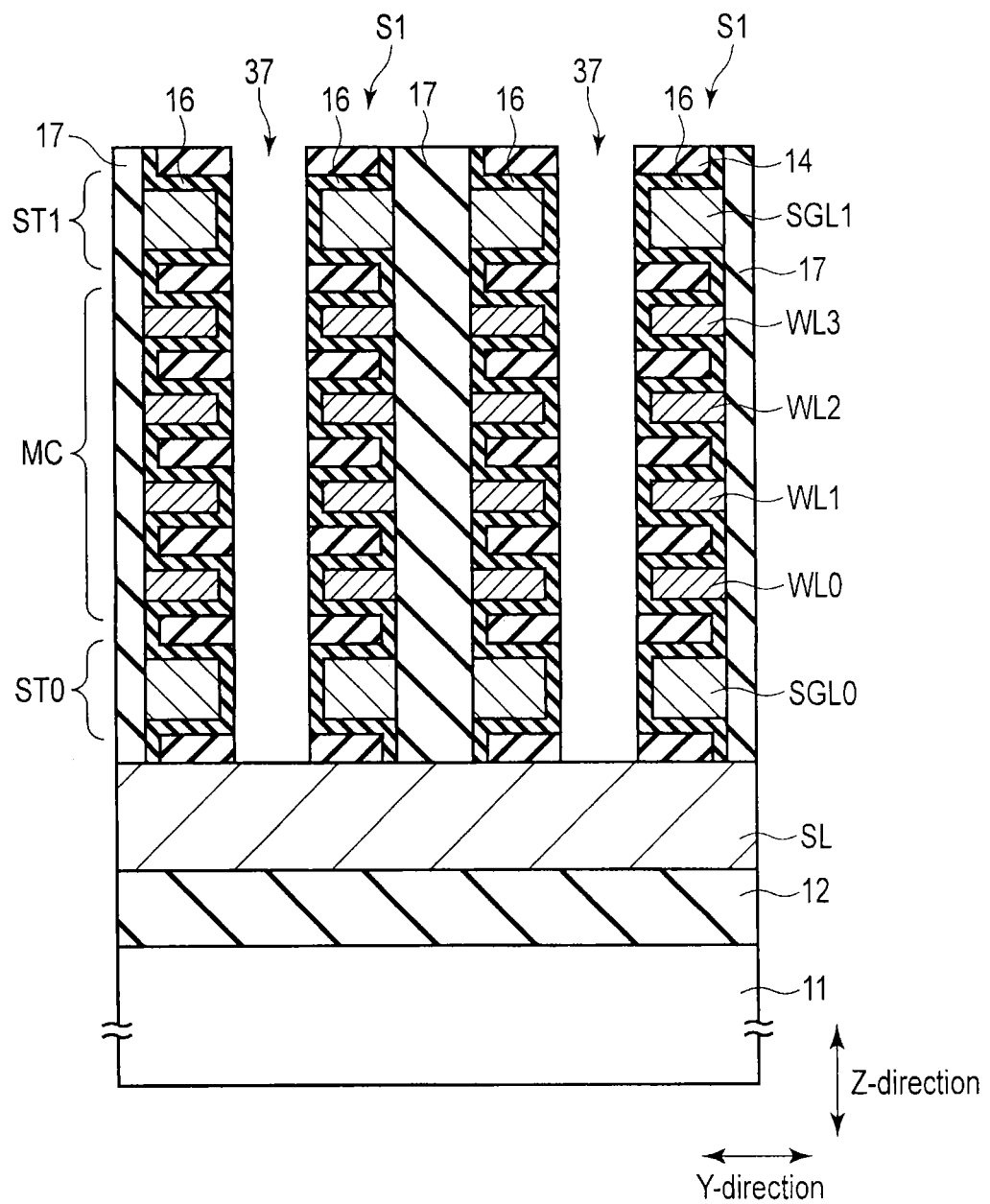
Figure 37:
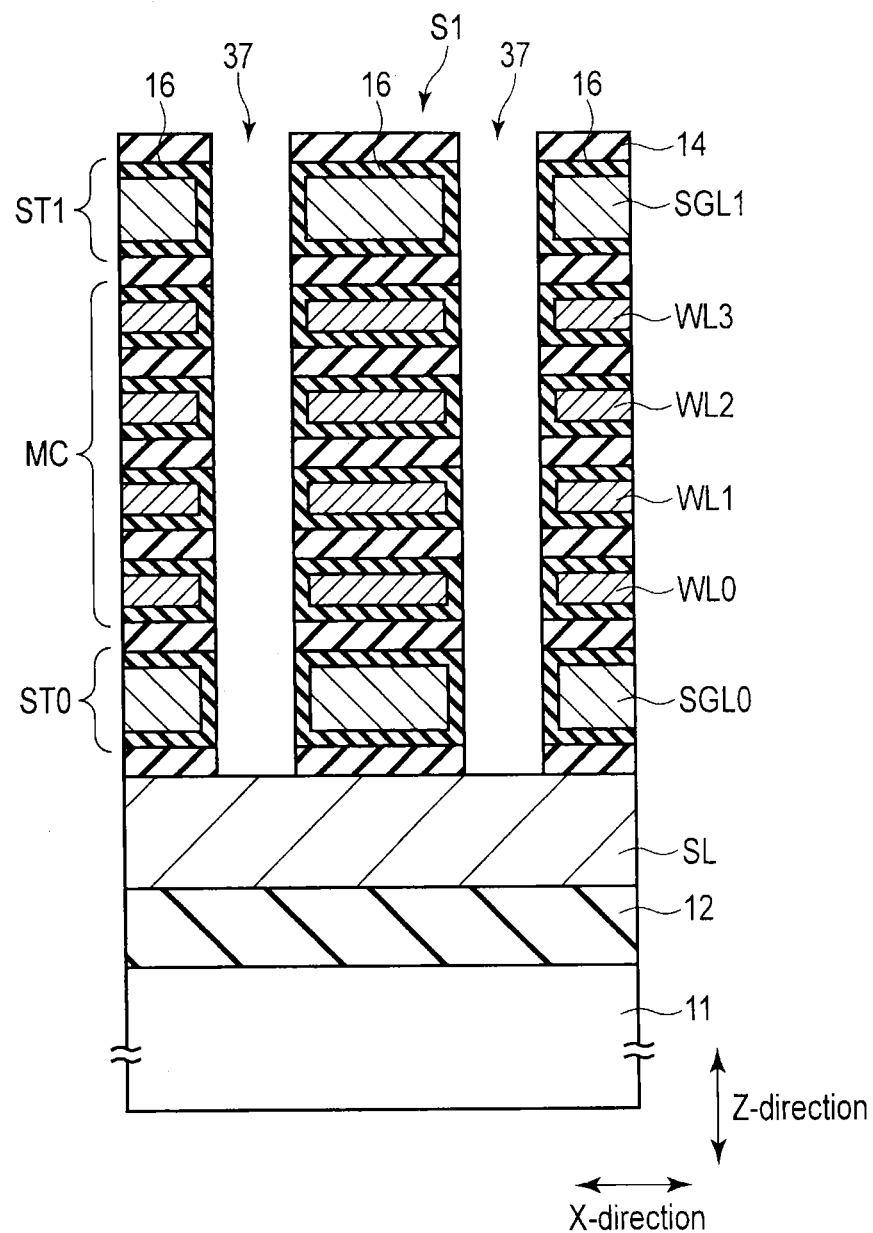

Thereafter, the dummy semiconductor layers 33 are selectively eliminated to thereby again form, in the first stacked structures S1, through-holes 37 reaching the source line SL, as is shown in FIGS. 36 and 37. Subsequently, the through-holes 37 are filled with oxide semiconductor layers serving as channel layers. The part of the oxide semiconductor layers existing outside the through-holes 37 are eliminated by, for example, CMP.

Figure 38:
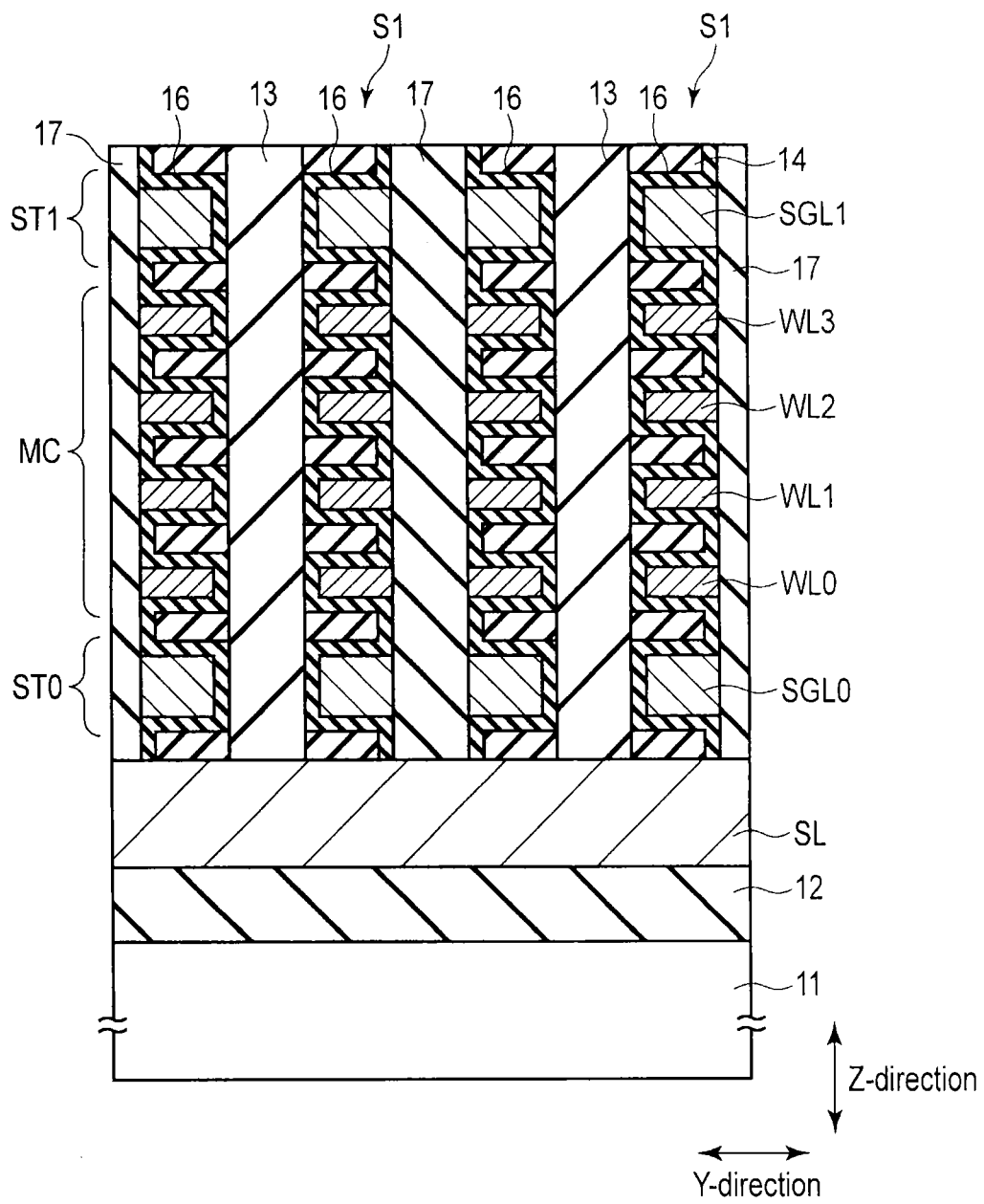
Figure 39:
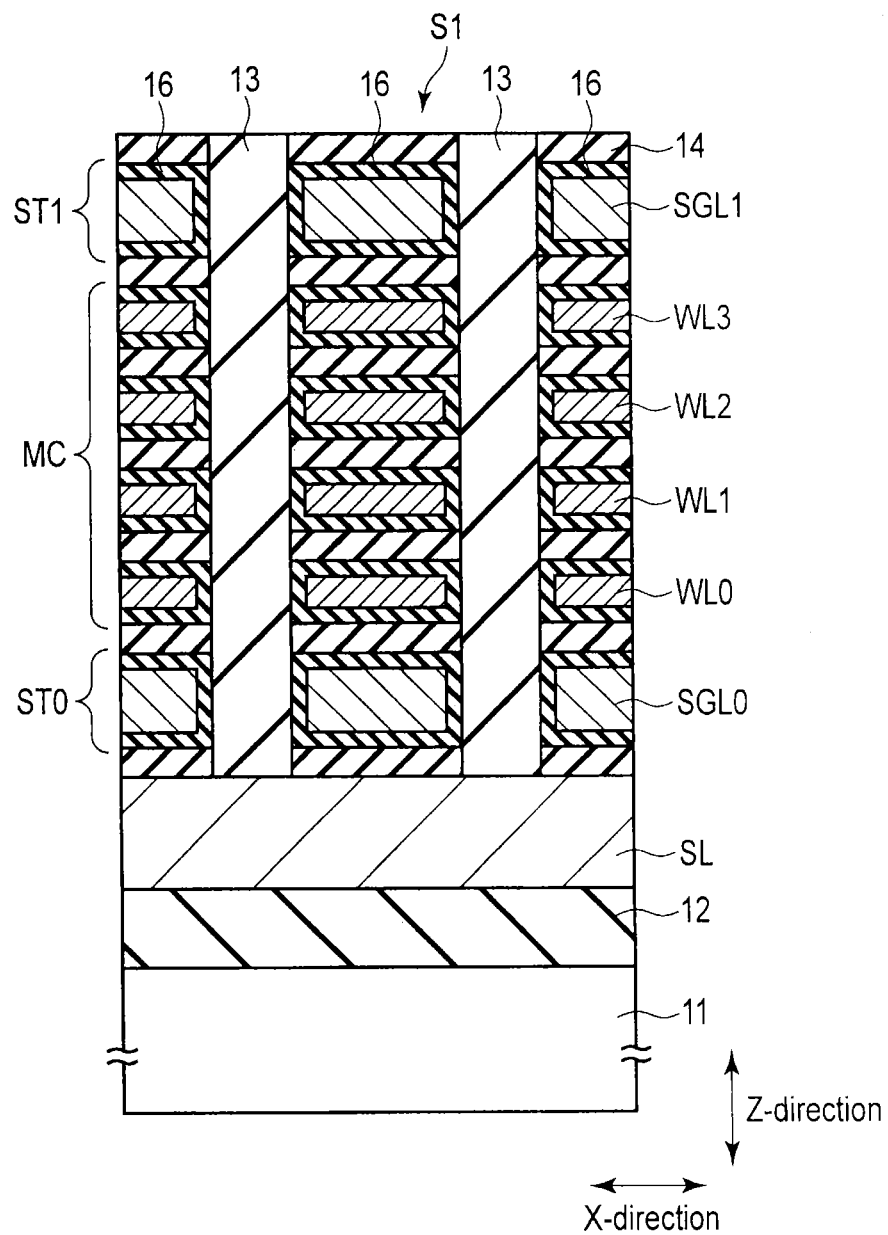

As a result, oxide semiconductor layers 13 extending through the first stacked structures S1 and connected to the source line SL are formed in the Z direction, as is shown in FIGS. 38 and 39. Namely, the dummy semiconductor layers 33 are replaced with the oxide semiconductor layers 13.

The oxide semiconductor layers 13 are formed of a compound containing an element selected from a group consisting of In, Ga, Zn and Sn.

Since the oxide semiconductor layers 13 contact the first to seventh insulating layers 14, low-resistance areas are formed in the contact portions of the oxide semiconductor layers 13.

For instance, if the first to seventh insulating layers 14 are silicon-rich oxide silicon layers, oxygen in the oxide semiconductor layers 13 moves to the silicon-rich oxide silicon layers, whereby the oxide semiconductor layers 13 is deoxidized and hence low-resistance areas are formed therein.

On the other hand, if the first to seventh insulating layers 14 are silicon-rich oxide silicon layers, the oxygen in the oxide semiconductor layers 13 moves to the silicon-rich oxide silicon layers, whereby the oxide semiconductor layers 13 is deoxidized and hence low-resistance areas are formed therein.

After that, contact plugs, bit lines, etc., are formed by known techniques.

As a result, a three-dimensional nonvolatile semiconductor memory device having low-resistance areas 15 is completed as shown in, for example, FIGS. 1 to 3.

5. Conclusion

In the above-described embodiments, high-speed read/write operations and suppression of a short-channel effect (off-leak current) can be simultaneously realized by virtue of the low-resistance areas in the oxide semiconductor layers. Accordingly, high performance and high integration can be achieved in the three-dimensional semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising: a first stacked layer structure stacked in order of a first insulating layer, a first electrode layer, an n-th insulating layer, an n-th electrode layer, and an (n+1)-th insulating layer in a first direction, where n is a natural number; an oxide semiconductor layer extending through the first to n-th electrode layers in the first direction; a second stacked layer structure provided between the first to n-th electrode layers and the oxide semiconductor layer, and including a charge storage layer which storages charges; and an area provided in the oxide semiconductor layer, being in contact with at least one of the first to (n+1)-th insulating layers, having a composition ratio of oxygen lower than a composition ratio of oxygen in the oxide semiconductor layer.

2. The device of claim 1, wherein at least one of the first to (n+1)-th insulating layers contacting the area comprises a material having a function which deoxidizes the oxide semiconductor layer.

3. The device of claim 1, wherein at least one of the first to (n+1)-th insulating layers contacting the area comprises one layer selected from a group of a silicon oxide layer with silicon-rich and an insulating layer with hydrogen-rich.

4. The device of claim 1, wherein at least one of the first to (n+1)-th insulating layers contacting the area comprises one layer selected from a group of a silicon oxide layer with silicon-rich and an insulating layer with hydrogen-rich, and further comprises two insulating layers sandwiching the one layer in the first direction.

5. The device of claim 1, wherein the oxide semiconductor layer includes an element selected from a group of In, Ga, Zn, and Sn.

6. The device of claim 5, wherein the oxide semiconductor layer is InGaZn-oxide.

7. The device of claim 1, wherein the n is a natural number equal to or larger than 3, each of the first and n-th electrode layers is a gate of a select transistor, and each of the second to (n−1)-th electrode layers is a gate of a memory cell.

8. The device of claim 7, wherein the n is a natural number equal to or larger than 4, and the area is in contact with the third to (n−1)-th insulating layers.

9. The device of claim 7, wherein the area is in contact with the second and n-th insulating layers.

10. The device of claim 7, wherein the area is in contact with the first and (n+1)-th insulating layers.

11. The device of claim 1, wherein the area surrounds the oxide semiconductor layer.

12. The device of claim 3, wherein a width of the area in the first direction is substantially equal to a width of one layer selected from a group of the silicon oxide layer with silicon-rich and the insulating layer with hydrogen-rich contacting the area in the first direction.

13. The device of claim 1, wherein the second stacked layer structure comprises a first insulating layer and a second insulating layer surrounding the oxide semiconductor layer, and the charge storage layer is provided between the first insulating layer and the second insulating layer.

14. The device of claim 1, further comprising:
a first conductive layer connected to a first end of the oxide semiconductor layer; and
a second conductive layer connected to a second end of the oxide semiconductor layer and extending in a second direction intersecting the first direction,
wherein the first to n-th electrode layers extend in a third direction intersecting the first and second directions.

15. The device of claim 14, wherein the first conductive layer extends in the second or third directions.

16. The device of claim 1,
wherein the oxide semiconductor layer is provided around a core layer extending in the first direction.

17. The device of claim 1,
wherein the area has a resistance lower than a resistance of the oxide semiconductor layer.

18. A method of manufacturing the device of claim 1, the method comprising:
   forming a third stacked layer structure stacked in order of the first insulating layer, a first dummy layer, . . . the n-th insulating layer, an n-th dummy layer, and the (n+1)-th insulating layer in the first direction;
   forming a dummy semiconductor layer extending through the first to n-th dummy layers in the first direction;
   removing the first dummy layer to n-th dummy layer after forming the dummy semiconductor layer;
   forming the second stacked layer structure and the first to n-th electrode layers surrounding the dummy semiconductor layer exposed by removing the first to n-th dummy layers; and
   replacing the dummy semiconductor layer with the oxide semiconductor layer.

19. The method of claim 18, further comprising:
   forming the area contacting at least one of the first to (n+1)-th insulating layers in the oxide semiconductor layer by contacting the oxide semiconductor layer with the first to (n+1)-th insulating layers.

20. The method of claim 19, further comprising:
   forming the area by deoxidizing the oxide semiconductor layer and moving an oxygen in the oxide semiconductor layer to a silicon oxide layer with silicon-rich, when at least one of the first to (n+1)-th insulating layers contacting the area is the silicon oxide layer with silicon-rich.

21. The method of claim 19, further comprising:
   forming the area by deoxidizing the oxide semiconductor layer and moving a hydrogen in an insulating layer with hydrogen-rich to the oxide semiconductor layer, when at least one of the first to (n+1)-th insulating layers contacting the area is the insulating layer with hydrogen-rich.

* * * * *